United States Patent
Nomura

(10) Patent No.: US 10,554,202 B2
(45) Date of Patent: Feb. 4, 2020

(54) GATE DRIVER

(71) Applicant: FUJI ELECTRIC CO., LTD., Kawasaki-shi, Kanagawa (JP)

(72) Inventor: Ichiro Nomura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 311 days.

(21) Appl. No.: 15/640,644

(22) Filed: Jul. 3, 2017

(65) Prior Publication Data
US 2018/0062633 A1 Mar. 1, 2018

(30) Foreign Application Priority Data
Aug. 31, 2016 (JP) .................. 2016-169542

(51) Int. Cl.
| H02H 9/00 | (2006.01) |
| H03K 17/082 | (2006.01) |
| H03K 17/16 | (2006.01) |
| H02M 1/08 | (2006.01) |
| H03K 3/012 | (2006.01) |

(52) U.S. Cl.
CPC .......... *H03K 17/0826* (2013.01); *H02M 1/08* (2013.01); *H03K 3/012* (2013.01); *H03K 17/163* (2013.01)

(58) Field of Classification Search
None
See application file for complete search history.

(56) References Cited

U.S. PATENT DOCUMENTS

| 5,909,199 A * | 6/1999 | Miyazaki | ............... G09G 3/294 345/60 |
| 8,102,192 B2 * | 1/2012 | Mourrier | ............. H03K 17/166 327/108 |
| 2008/0122497 A1 | 5/2008 | Ishikawa et al. | |
| 2014/0334214 A1 | 11/2014 | Katoh et al. | |

FOREIGN PATENT DOCUMENTS

| JP | 2008-092663 A | 4/2008 |
| JP | 5401174 B2 | 1/2014 |
| JP | 5700095 B2 | 4/2015 |
| JP | 5746954 B2 | 7/2015 |
| WO | WO-2013/093418 A1 | 6/2013 |

* cited by examiner

*Primary Examiner* — Stephen W Jackson
(74) *Attorney, Agent, or Firm* — Rabin & Berdo, P.C.

(57) ABSTRACT

A gate driver for driving a switching element includes turn-on current sources, turn-on switches, turn-off current sources, and turn-off switches. The turn-on current sources switch a voltage gradient of a rising edge waveform of a gate voltage of the switching element between a plurality of levels when the switching element is turned on. The turn-on switches drive and control the turn-on current sources. The turn-off current sources switch a voltage gradient of a falling edge waveform of the gate voltage between a plurality of levels when the switching element is turned off. The turn-off switches drive and control the turn-off current sources.

7 Claims, 26 Drawing Sheets

TL1

| | TURN-ON SIDE | TURN-OFF SIDE |
|---|---|---|
| PATTERN #1 | $Igon2 < Igon1, Igon3$ AND $Igon1 < Igon3$ | $Igoff2 < Igoff1, Igoff3$ AND $Igoff3 < Igoff1$ |
| PATTERN #2 | $Igon2 < Igon1, Igon3$ AND $Igon3 < Igon1$ | $Igoff2 < Igoff1, Igoff3$ AND $Igoff1 < Igoff3$ |
| PATTERN #3 | $Igon3 < Igon2 < Igon1$ | $Igoff3 < Igoff2 < Igoff1$ |

FIG. 7

GATE DRIVER

CROSS-REFERENCE TO RELATED APPLICATION

This application is based upon and claims the benefit of priority of the prior Japanese Patent Application No. 2016-169542, filed on Aug. 31, 2016, the entire contents of which are incorporated herein by reference.

BACKGROUND OF THE INVENTION

1. Field of the Invention

The embodiments discussed herein relate to a gate driver that drives a gate of a switching element.

2. Background of the Related Art

A power converter, such as an inverter, is provided with a bridge circuit in which switching elements (such as a metal oxide semiconductor field effect transistor (MOSFET) and an insulated gate bipolar transistor (IGBT)) are connected in series.

The bridge circuit is configured such that a switching element of a high electric potential side and a switching element of a low electric potential side are connected in series and that a load is connected to a midpoint electric potential. The gates of the switching elements are driven to turn on and off the switching elements in order to drive the load.

As a conventional technology related to driving a gate of a switching element, there is proposed a technology that detects a gate voltage value of a switching element and changes a gate drive resistance or drive current on the basis of the detected gate voltage value (Japanese Laid-open Patent Publication No. 2008-92663).

In the conventional technology, when the gate of the switching element is driven, voltage of a high electric potential or a low electric potential is applied from a direct-current power supply via a resistor, in order to control and drive the gate of the switching element by the electric current that flows through the resistor.

However, this gate driving controls charging and discharging of a parasitic capacitance of the switching element via the resistor, and thus is unable to set an arbitrary voltage gradient for an instantaneous voltage value at a rising edge and a falling edge of the gate voltage of the switching element.

Hence, for example, it is difficult to adjust the voltage gradient to suppress the rise of the surge voltage generated when the switching element is turned off and the surge current that occurs when the switching element is turned on or to reduce a switching loss. Therefore, the quality of the power converter is deteriorated.

SUMMARY OF THE INVENTION

According to one aspect, there is provided a gate driver including: a plurality of turn-on current sources that switch a voltage gradient of a rising edge waveform of a gate voltage of a switching element between a plurality of levels, when the switching element is turned on; a plurality of turn-on switches that drive and control the turn-on current sources; a plurality of turn-off current sources that switch a voltage gradient of a falling edge waveform of the gate voltage between a plurality of levels, when the switching element is turned off; and a plurality of turn-off switches that drive and control the turn-off current sources.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 illustrates three examples of patterns of a relationship between current values of electric current sources;

DETAILED DESCRIPTION OF THE INVENTION

In the following, embodiments will be described with reference to the drawings.

Figure 1:
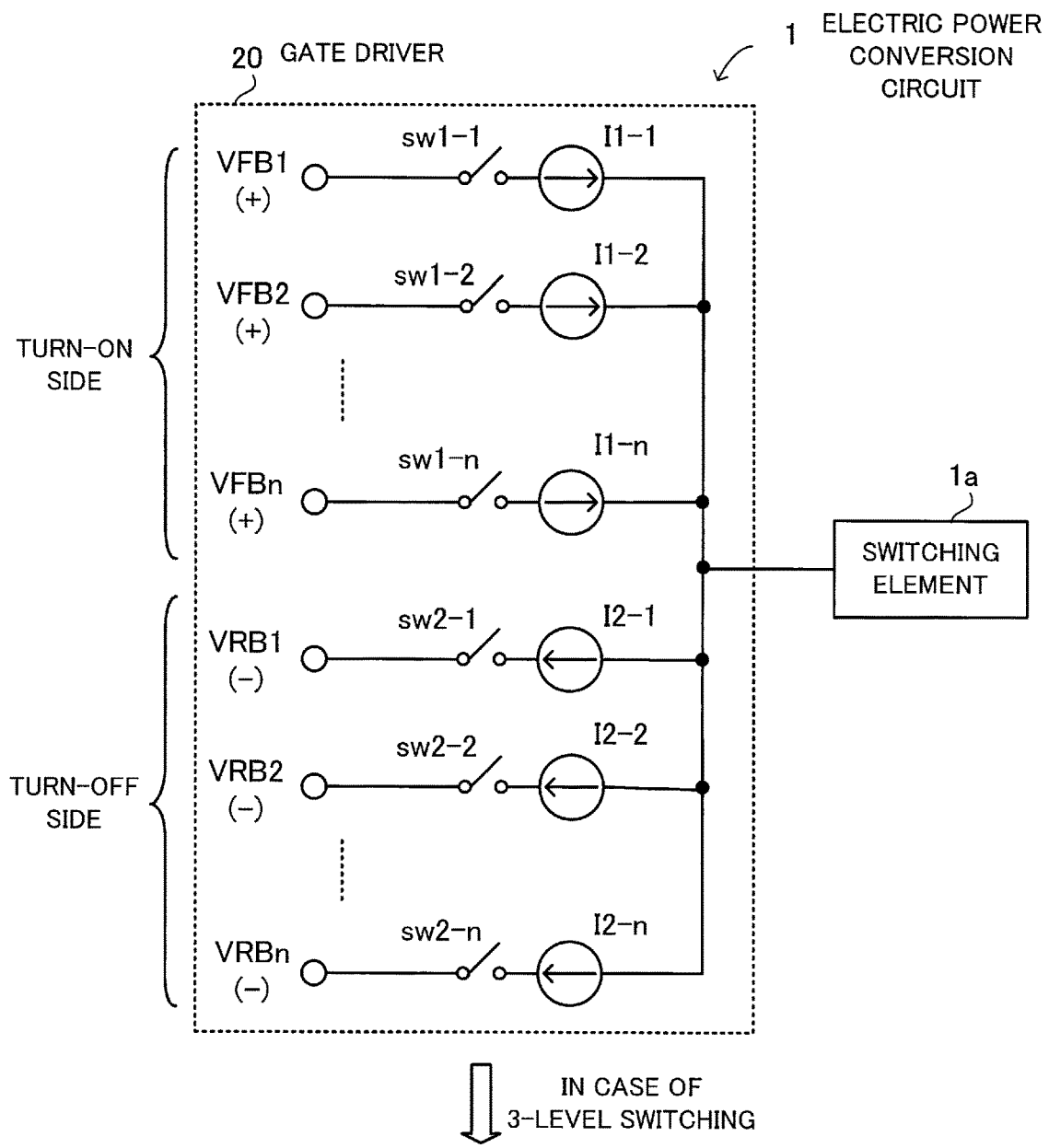
FIG. 1 illustrates an example of a configuration of an electric power conversion circuit that includes a gate drive circuit of the present embodiment.
Figure 1:
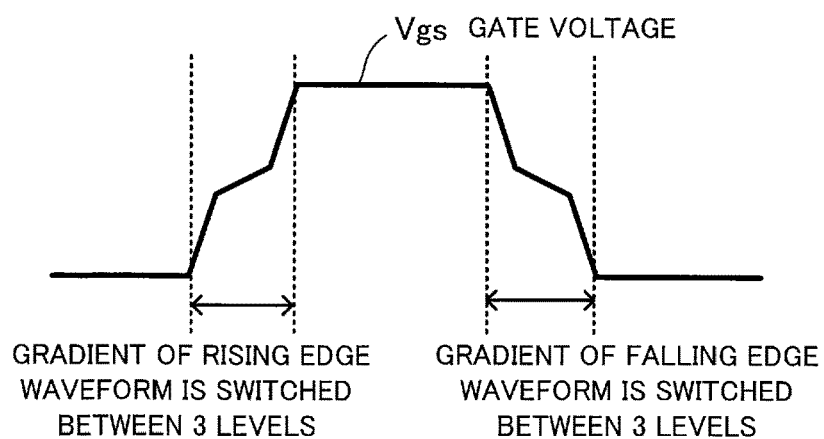

FIG. 1 illustrates an example of a configuration of an electric power conversion circuit that includes a gate drive circuit of the present embodiment. The electric power conversion circuit 1 includes a switching element 1a and a gate driver 20. The gate driver 20 includes turn-on current sources I1-1 to I1-n, turn-on switches sw1-1 to sw1-n, turn-off current sources I2-1 to I2-n, and turn-off switches sw2-1 to sw2-n.

Note that positive direct-current power supplies VFB1(+) to VFBn(+) are connected to ends of the turn-on switches sw1-1 to sw1-n, and negative direct-current power supplies VRB1(−) to VRBn(−) are connected to ends of the turn-off switches sw2-1 to sw2-n.

When the switching element 1a is turned on, each of the turn-on current sources I1-1 to I1-n flows turn-on gate current through the gate of the switching element 1a to switch the voltage gradient of a rising edge waveform of a gate voltage (gate-source voltage) of the switching element 1a between a plurality of levels. The turn-on switches sw1-1 to sw1-n drive and control the turn-on current sources I1-1 to I1-n, respectively.

When the switching element 1a is turned off, each of the turn-off current sources I2-1 to I2-n sinks turn-off gate current from the gate to switch the voltage gradient of a falling edge waveform of the gate voltage of the switching element 1a between a plurality of levels. The turn-off switches sw2-1 to sw2-n drive and control the turn-off current sources I2-1 to I2-n, respectively.

Here, the rising edge waveform of the gate voltage of the switching element 1a is divided into n (≥3) rising edge periods, and the voltage gradient of the rising edge waveform is switched between n levels. In this case, there are provided n turn-on current sources and n turn-on switches for flowing different turn-on gate currents through the gate of the switching element 1a during the divided rising edge periods.

For example, when n is equal to 3 and the rising edge waveform is switched between three levels, there are provided three turn-on current sources I1-1 to I1-3 and three turn-on switches sw1-1 to sw1-3.

The turn-on switches sw1-1 to sw1-3 are turned on during three periods respectively, so that different turn-on gate currents flow through the gate of the switching element 1a from the turn-on current sources I1-1 to I1-3 during the respective periods. Thereby, as illustrated in FIG. 1, the gate voltage Vgs of the switching element 1a rises by switching the voltage gradient between three levels.

Also, in the same way, the falling edge waveform of the gate voltage of the switching element 1a is divided into n falling edge periods, and the voltage gradient of the falling edge waveform of the gate voltage of the switching element 1a is switched between n levels. In this case, there are provided n turn-off current sources and n turn-off switches for sinking different turn-off gate currents from the gate during the divided falling edge periods.

For example, when n is equal to 3 and the falling edge waveform is switched between three levels, there are provided three turn-off current sources I2-1 to I2-3 and three turn-off switches sw2-1 to sw2-3.

The turn-off switches sw2-1 to sw2-3 are turned on during three periods respectively, so that different turn-off gate currents are sunk from the gate of the switching element 1a by the turn-off current sources I2-1 to I2-3 during the respective periods. Thereby, as illustrated in FIG. 1, the gate voltage Vgs of the switching element 1a falls by switching the voltage gradient between three levels.

As described above, the gate driver 20 of the present embodiment is configured to switch the voltage gradients of the rising edge waveform and the falling edge waveform of the gate voltage of the switching element 1a between a plurality of levels.

For example, this configuration suppresses the rise of the surge voltage generated when the switching element 1a is turned off and the surge current that occurs when the switching element 1a is turned on, and facilitates the adjustment for reducing a switching loss, thereby improving the quality of the power converter.

Although in the above there are provided n turn-on current sources that flow different turn-on gate currents through the gate of the switching element, n turn-on current sources that flow the same turn-on gate current may be provided. In this case, the value of the gate current is changed by simultaneously driving several turn-on current sources among the n turn-on current sources in order to set the rising edge voltage gradient.

With regard to turning off, n turn-off current sources that flow the same turn-off gate current may be provided in the same way, so that the value of the gate current is changed by simultaneously driving several turn-off current sources among the n turn-off current sources in order to set the falling edge voltage gradient.

Next, before the detail of the technology of the present embodiment is described, a configuration of a conventional gate drive circuit and its problem to be solved will be described with reference to FIGS. 2 and 3.

Figure 2:
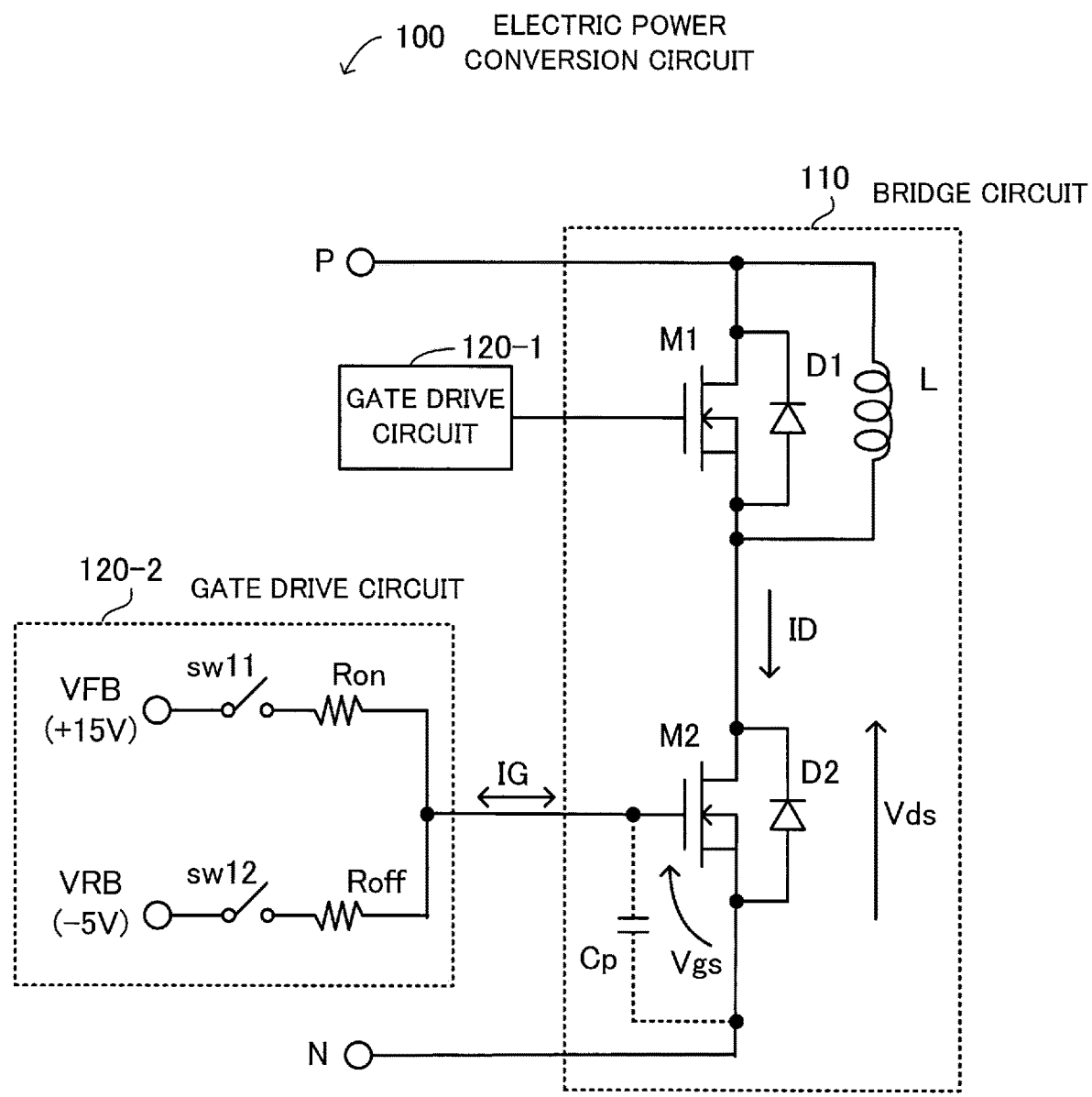
FIG. 2 illustrates an example of a configuration of a conventional electric power conversion circuit that includes conventional gate drive circuits.

FIG. 2 illustrates an example of a configuration of a conventional electric power conversion circuit that includes conventional gate drive circuits. The electric power conversion circuit 100 illustrated in FIG. 2 includes a bridge circuit 110 and gate drive circuits 120-1 and 120-2.

The bridge circuit 110 includes switching elements M1 and M2, diodes D1 and D2, and an inductor L. N-channel metal oxide semiconductor (NMOS) field effect transistors (FETs) are used in the switching elements M1 and M2. Also, the inductor L represents an inductive load, such as a motor.

Further, the diodes D1 and D2 are used as freewheeling diodes (FWD) for circulating the load electric current generated when the load is driven by turning on/off the electric current of the inductive load, and are connected in antiparallel with the switching elements M1 and M2.

On the other hand, the gate drive circuit 120-2 includes resistors Ron and Roff, switches sw11 and sw12, and direct-current power supplies VFB and VRB. Note that the gate drive circuit 120-1 has the same configuration as the gate drive circuit 120-2 (the inner configuration of the gate drive circuit 120-1 is not illustrated).

As for the connection relationship between elements, the drain of the switching element M1 is connected to the cathode of the diode D1, one end of the inductor L, and a P terminal. The P terminal corresponds to a positive electrode power supply terminal.

The source of the switching element M1 is connected to the anode of the diode D1, the other end of the inductor L, the drain of the switching element M2, and the cathode of the diode D2.

The source of the switching element M2 is connected to the anode of the diode D2 and an N terminal. The N terminal corresponds to a negative electrode power supply terminal (or a GND terminal). The gate drive circuit 120-1 is connected to the gate of the switching element M1, and the gate drive circuit 120-2 is connected to the gate of the switching element M2.

In the gate drive circuit 120-2, the direct-current power supply VFB is connected to one end of the switch sw11; another end of the switch sw11 is connected to one end of the resistor Ron; and the other end of the resistor Ron is connected to the gate of the switching element M2. The direct-current power supply VFB is a power supply of +15 V, for example.

The direct-current power supply VRB is connected to one end of the switch sw12; another end of the switch sw12 is connected to one end of the resistor Roff; and the other end of the resistor Roff is connected to the gate of the switching element M2. The direct-current power supply VRB is a power supply of −5 V, for example.

Note that the switching elements M1 and M2 have parasitic capacitances, and FIG. 2 illustrates a parasitic capacitance Cp of the switching element M2 which exists between the gate and the source of the switching element M2.

Next, gate driving operation of the switching element M2 will be described. In order to turn on the switching element M2, the switch sw11 is turned on (while the switch sw12 is off), and the gate of the switching element M2 is raised to a high electric potential level (hereinafter, H level) of +15 V of the direct-current power supply VFB.

Also, in order to turn off the switching element M2, the switch sw12 is turned on (while the switch sw11 is off), and the gate of the switching element M2 is lowered to a low electric potential level (hereinafter, L level) of −5 V.

Figure 3:
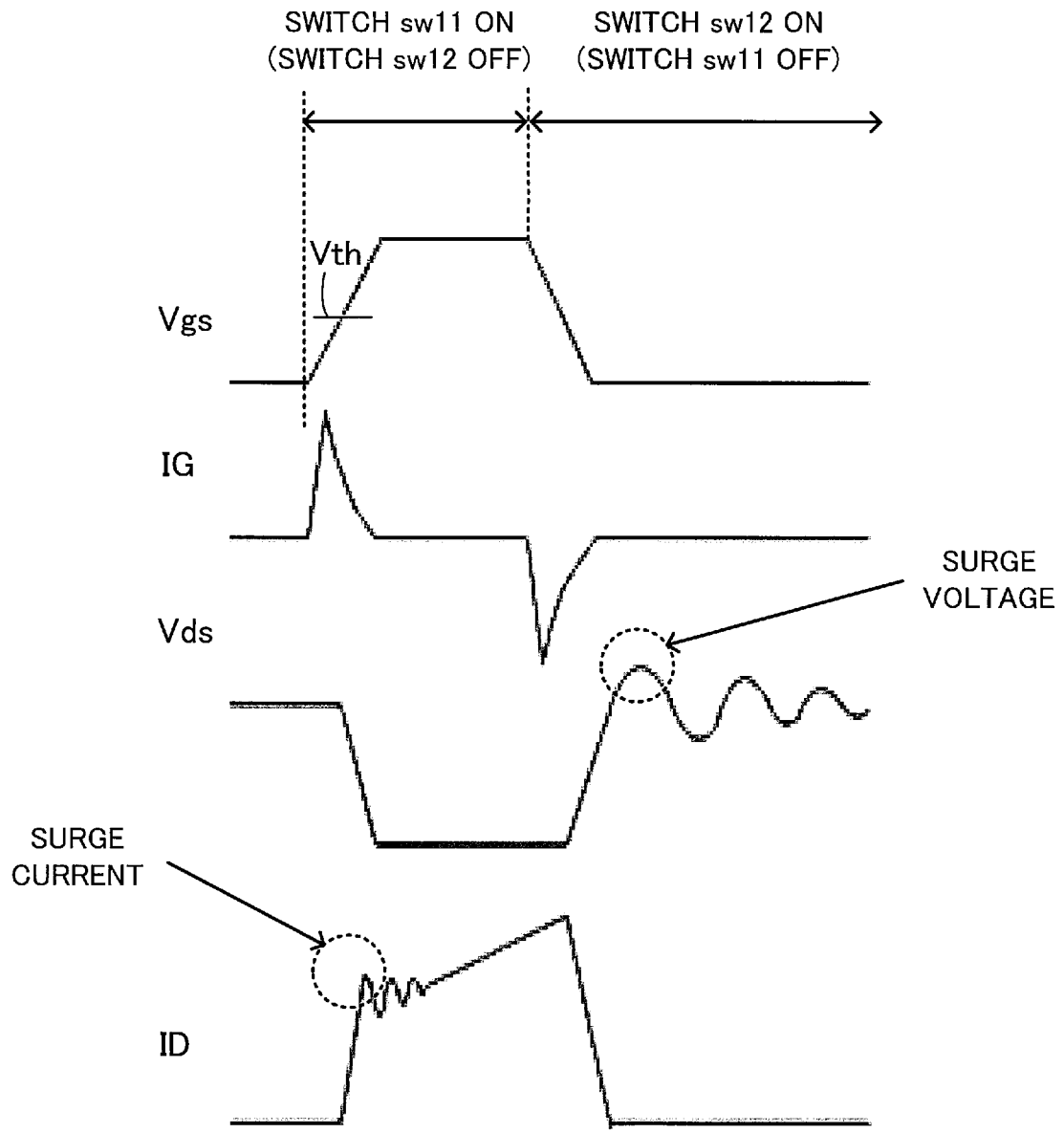
FIG. 3 illustrates operation waveforms of a conventional technology.

FIG. 3 illustrates operation waveforms of the conventional technology. Waveforms of gate voltage Vgs, gate current IG, drain voltage (drain-source voltage) Vds, and drain current ID are illustrated as the operation waveforms of the switching element M2.

When the gate voltage Vgs starts rising and exceeds a threshold voltage Vth, the drain current ID starts flowing. Also, when the drain current ID flows to make the switching element M2 conductive, the drain voltage Vds drops.

On the other hand, the gate current IG that flows between the gate drive circuit 120-2 and the gate of the switching element M2 charges and discharges the parasitic capacitance of the switching element M2, which is generated by an integration circuit composed of the resistors Ron and Roff and the parasitic capacitance Cp.

Next, a problem to be solved will be described. In general, gate driving control of the switching elements has a trade-off relationship between reduction of switching loss and suppression of rise of the surge voltage in the drain voltage Vds generated at the time of turning off and the surge current in the drain current ID generated at the time of turning on.

For example, if the resistance values of the resistors Ron and Roff connected to the switching element M2 are made smaller in the configuration of FIG. 2, the switching speed becomes faster to reduce the switching loss, but the surge voltage in the drain voltage Vds and the surge current in the drain current ID become larger.

Conversely, if the resistance values of the resistors Ron and Roff are made larger, the switching speed becomes slower to reduce the surge voltage and the surge current, but the switching loss increases.

It is desired to appropriately adjust the speeds of turning on and turning off of the switching element in order to improve this trade-off relationship. However, the gate drive circuit 120-2 illustrated in FIG. 2 is configured to switch the switching element M2 by charging and discharging the parasitic capacitance Cp of the switching element M2 via the resistors Ron and Roff.

Hence, the voltage gradients of the rising edge and the falling edge of the gate voltage Vgs are decided solely on the basis of a constant voltage gradient of charging and discharging of the RC time constant, and an arbitrary voltage gradient is unable to be set for an instantaneous voltage value at the rising edge and the falling edge of the gate voltage.

Thus, in the conventional technology, it has been difficult to improve the trade-off relationship between the reduction of the switching loss and the suppression of the surge voltage in the drain voltage Vds and the surge current in the drain current ID which are generated during rising or falling of the gate voltage Vgs.

In consideration of this point, the present embodiment provides a gate driver that drives the gate at an arbitrary voltage gradient set for the instantaneous gate voltage value in order to improve the quality of the power converter.

Figure 4:
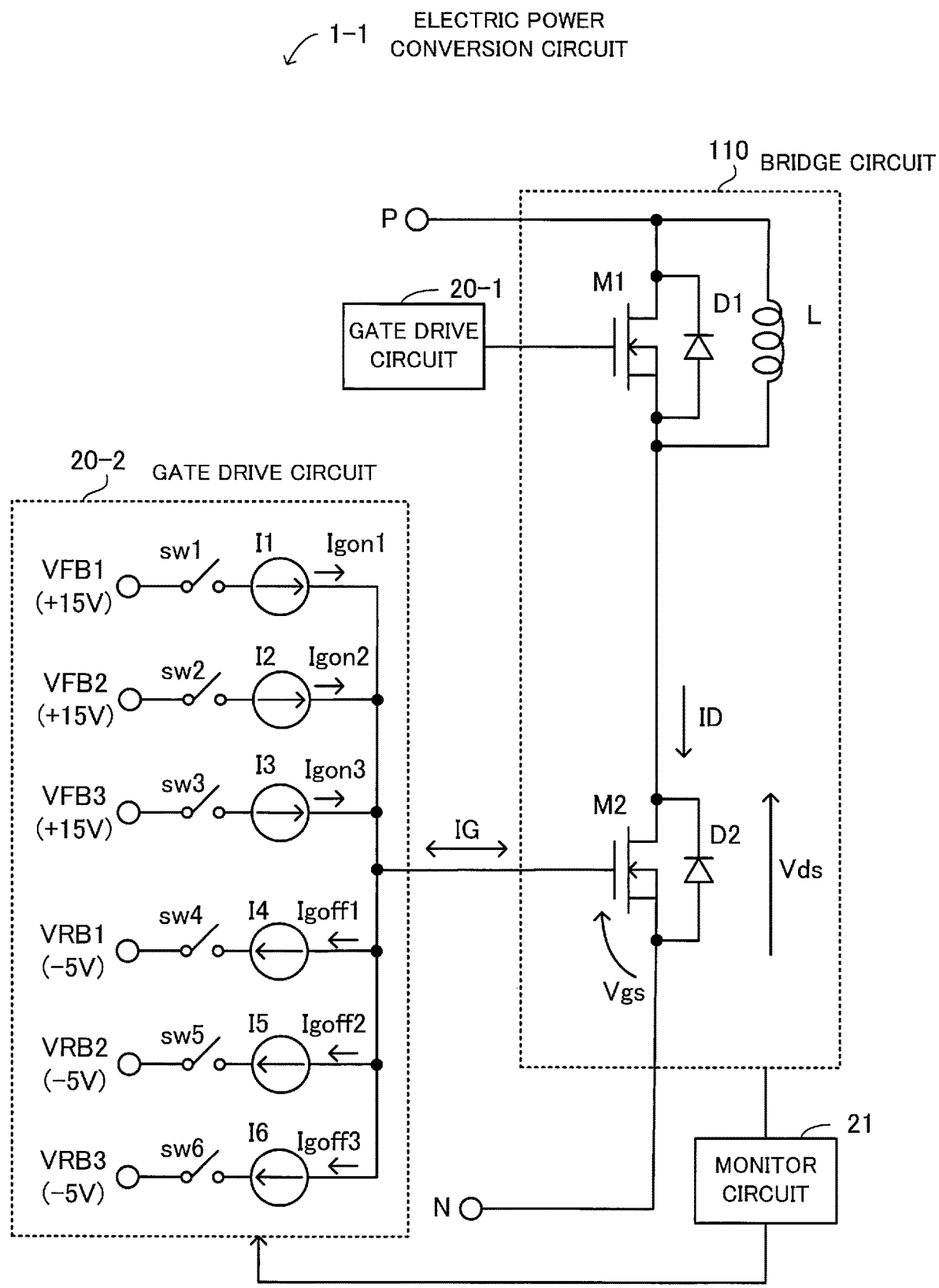
FIG. 4 illustrates an example of a configuration of an electric power conversion circuit of the present embodiment.

Next, an electric power conversion circuit that employs the gate driver of the present embodiment illustrated in FIG. 1 will be described in detail below. FIG. 4 illustrates an example of a configuration of the electric power conversion circuit of the present embodiment. The electric power conversion circuit 1-1 includes a bridge circuit 110, gate drive circuits 20-1 and 20-2, and a monitor circuit 21.

The bridge circuit 110 has the same configuration as illustrated in FIG. 2 and thus includes the switching elements M1 and M2, the diodes D1 and D2, and the inductor L. Note that the entirety or a part of the switching elements M1 and M2 and the diodes D1 and D2 is an element made of wide band gap semiconductor, for example. In this case, the wide band gap semiconductor consists of silicon carbide, gallium nitride based material, gallium oxide based material, or diamond, or any combination thereof.

On the other hand, the gate drive circuit 20-2 includes electric current sources I1 to I3 (first to third turn-on current sources), switches sw1 to sw3 (first to third turn-on switches), and direct-current power supplies VFB1 to VFB3 (for example, +15V), as elements of a turn-on side.

Also, the gate drive circuit 20-2 includes electric current sources I4 to I6 (first to third turn-off current sources), switches sw4 to sw6 (first to third turn-off switches), and direct-current power supplies VRB1 to VRB3 (for example, −5V), as elements of a turn-off side.

The electric current source I1 flows electric current Igon1; the electric current source I2 flows electric current Igon2; and the electric current source I3 flows electric current Igon3. The electric current Igon1, the electric current Igon2, and the electric current Igon3 are turn-on gate currents whose current values are different from each other.

Also, the electric current source I4 flows electric current Igoff1; the electric current source I5 flows electric current Igoff2; and the electric current source I6 flows electric current Igoff3. The electric current Igoff1, the electric current Igoff2, and the electric current Igoff3 are turn-off gate currents whose current values are different from each other.

Although the elements of the turn-on side include three electric current sources I1 to I3 and three switches sw1 to sw3, the elements of the turn-on side may include four or more electric current sources and four or more switches.

In the same way, although the elements of the turn-off side include three electric current sources I4 to I6 and three switches sw4 to sw6, the elements of the turn-off side may include four or more electric current sources and four or more switches. Also, the gate drive circuit 20-1 has the same configuration as the gate drive circuit 20-2 (the inner configuration of the gate drive circuit 20-1 is not illustrated).

When the switching elements M1 and M2 are turned off, the monitor circuit 21 detects overvoltage in which the drain voltage Vds exceeds a threshold value for a certain amount of time. When the overvoltage is detected, the monitor circuit 21 turns on at least one of the switches sw1 to sw3 and supplies at least one of the electric currents Igon1 to Igon3 to the gate (which is described later in FIG. 14).

A connection relationship between the elements of the gate drive circuit 20-2 will be described. The direct-current power supply VFB1 is connected to one end of the switch sw1; another end of the switch sw1 is connected to one end of the electric current source I1; and the other end of the electric current source I1 is connected to the gate of the switching element M2.

Also, the direct-current power supply VFB2 is connected to one end of the switch sw2; another end of the switch sw2 is connected to one end of the electric current source I2; and the other end of the electric current source I2 is connected to the gate of the switching element M2. Further, the direct-current power supply VFB3 is connected to one end of the switch sw3; another end of the switch sw3 is connected to one end of the electric current source I3; and the other end of the electric current source I3 is connected to the gate of the switching element M2.

The direct-current power supply VRB1 is connected to one end of the switch sw4; another end of the switch sw4 is connected to one end of the electric current source I4; and the other end of the electric current source I4 is connected to the gate of the switching element M2.

Also, the direct-current power supply VRB2 is connected to one end of the switch sw5; another end of the switch sw5 is connected to one end of the electric current source I5; and the other end of the electric current source I5 is connected to the gate of the switching element M2. Further, the direct-current power supply VRB3 is connected to one end of the switch sw6; another end of the switch sw6 is connected to one end of the electric current source I6; and the other end of the electric current source I6 is connected to the gate of the switching element M2.

Next, gate voltage gradient setting control for setting voltage gradients of waveforms of a rising edge and a falling edge of the gate voltage will be described. Note that the switching elements M1 and M2 are controlled in the same manner, and thus the control over the switching element M2 will be described mainly in the following.

In the electric power conversion circuit 1-1, the rising edge period at the time of turning on the switching element M2 is divided into three periods t1, t2, and t3, and the falling edge period at the time of turning off of the switching element M2 is divided into three periods t4, t5, and t6.

The electric power conversion circuit 1-1 sets the voltage gradient of the gate voltage Vgs, by turning on one of the switches sw1 to sw6 to flow a predetermined gate current, during each of the periods t1 to t6.

Figure 5:
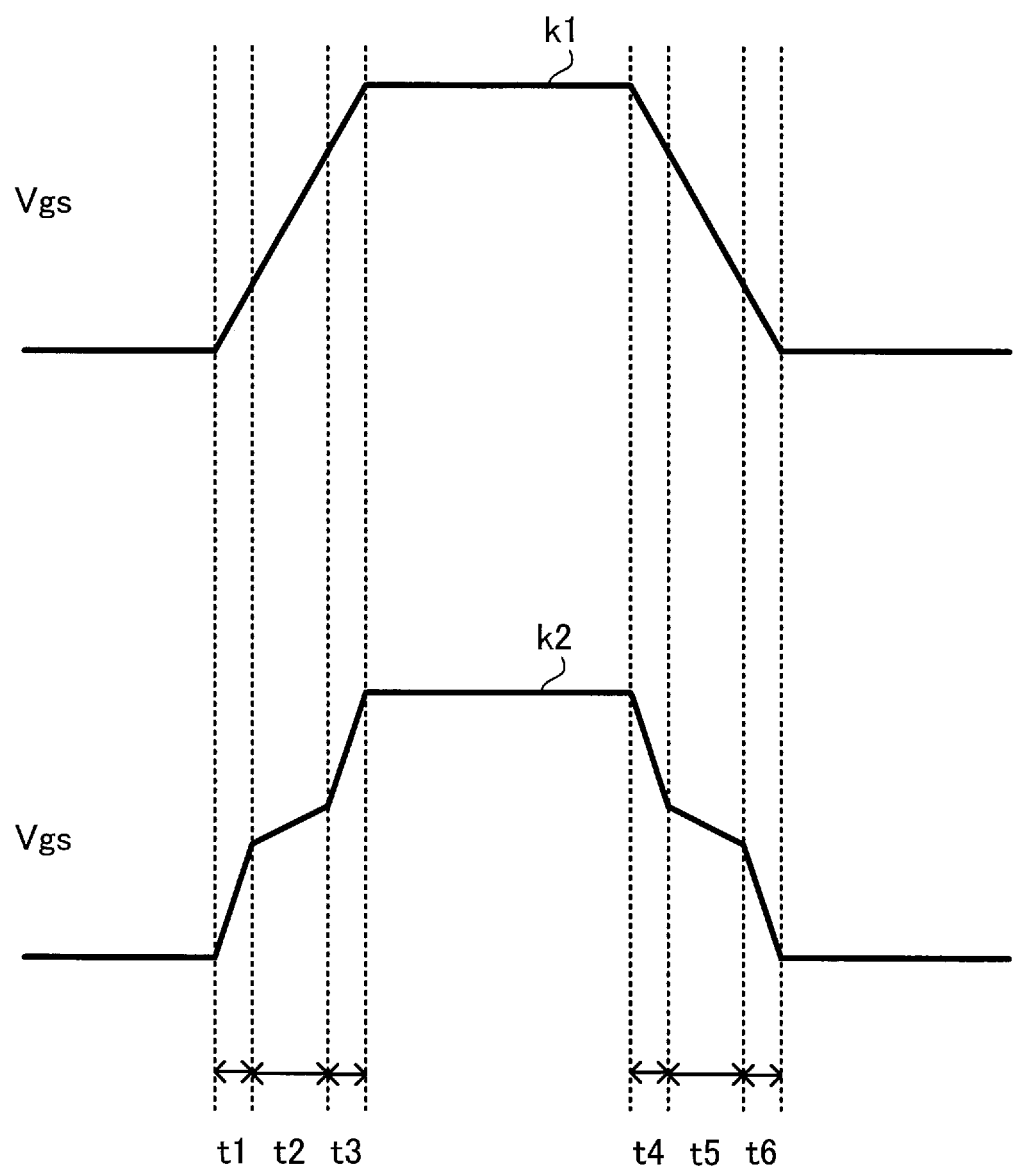
FIG. 5 is a diagram for describing setting of voltage gradients of a gate voltage of the present embodiment.

FIG. 5 is a diagram for describing setting of voltage gradients of the gate voltage of the present embodiment. A waveform k1 indicates the gate voltage Vgs for which an arbitrary voltage gradient is unable to be set for the instantaneous voltage values of the rising edge and the falling edge (i.e., a case of the conventional configuration in which the voltage gradients are decided fixedly by the RC time constant).

On the other hand, a waveform k2 indicates the gate voltage Vgs for which an arbitrary voltage gradient is able to be set for the instantaneous voltage values of the rising edge and the falling edge (i.e., a case of the configuration of FIG. 4 of the present embodiment).

Of the periods t1 to t3 at the time of turning on, the period t1 begins at a time point at which the gate voltage Vgs starts rising from a bottom level and ends at a time point at which the gate voltage Vgs reaches a Miller plateau during rising.

The period t2 includes the Miller plateau during the rise of the gate voltage Vgs. The period t3 begins at a time point at which the gate voltage Vgs goes out from the Miller plateau during rising and ends at a time point at which the gate voltage Vgs reaches a peak level. Note that the start point and the end point of the period t2 do not need to be exactly identical with the start point and the end point of the Miller plateau of the switching element. That is, the start point of the period t2 may be a time point in the vicinity of the start point of the Miller plateau of the switching element. Also, the end point of the period t2 may be a time point in the vicinity of the end point of the Miller plateau of the switching element.

Of the periods t4 to t6 at the time of turning off, the period t4 begins at a time point at which the gate voltage Vgs starts falling from the peak level and ends at a time point at which the gate voltage Vgs reaches a Miller plateau during falling.

The period t5 includes the Miller plateau during falling of the gate voltage Vgs. The period t6 begins at a time point at which the gate voltage Vgs goes out from the Miller plateau during falling and ends at a time point at which the gate voltage Vgs reaches the bottom level. Note that the start point and the end point of the period t5 do not need to be exactly identical with the start point and the end point of the Miller plateau of the switching element. That is, the start point of the period t5 may be a time point in the vicinity of the start point of the Miller plateau of the switching element. Also, the end point of the period t5 may be a time point in the vicinity of the end point of the Miller plateau of the switching element.

Figure 6:
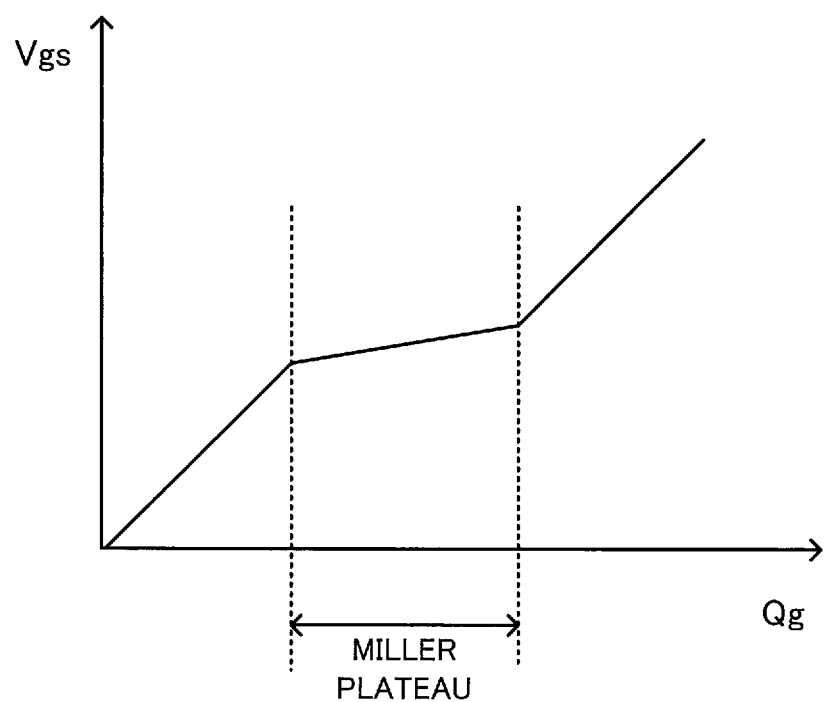
FIG. 6 is a diagram for describing a Miller plateau.

FIG. 6 is a diagram for describing the Miller plateau. FIG. 6 indicates the Miller plateau when the gate voltage Vgs rises, with the vertical axis representing the gate voltage Vgs and the horizontal axis representing a gate electric charge amount Qg. When the switching element M2 is turned on, the gate electric charge amount Qg and the gate voltage Vgs increase and reach what is called a Miller plateau in which the slope of the gate voltage Vgs is less steep.

The Miller plateau corresponds to a flow start of the drain current ID at the time of turning on, and corresponds to a flow end of the drain current ID at the time of turning off. Also, around the Miller plateau, the surge voltage generated in the drain voltage Vds tends to reach its peak, and the surge current generated in the drain current ID tends to reach its peak.

Returning to FIG. 5, the duration of each period will be described. With regard to the periods t1 and t6, the period t1 between the bottom level of the gate voltage Vgs and the Miller plateau and the period t6 between the Miller plateau and the bottom level are set short. Thereby, a simultaneous turned-off period (dead time) of the switching elements M1 and M2 is made shorter.

As the period for turning off both of the switching element M1 of the upper arm and the switching element M2 of the lower arm is made shorter, switching efficiency is enhanced. Thus, when the simultaneous turned-off period of the switching elements M1 and M2 is made shorter, the absolute values of the voltage gradients of the gate voltage Vgs of the waveform k2 during the periods t1 and t6 are set larger than the absolute values of the voltage gradients of the gate voltage Vgs of the waveform k1 during the periods t1 and t6, for example.

Note that, in this case, an advantage of reducing the switching loss is obtained in addition to the advantage of the shorter simultaneous turned-off period of the switching elements M1 and M2.

Also, the periods t2 and t5 correspond to the Miller plateau of the gate voltage Vgs. During the periods t2 and t5, the surge voltage and the surge current tend to reach their peaks as described above, and therefore the voltage gradient of the gate voltage Vgs is desirable to be small.

Thus, in order to suppress the peaks of the surge voltage and the surge current, the absolute values of the voltage gradients of the gate voltage Vgs of the waveform k2 during the periods t2 and t5 are set smaller than the absolute values of the voltage gradients of the gate voltage Vgs of the waveform k1 during the periods t2 and t5, for example.

Further, the period t3 between the Miller plateau and the peak level and the period t4 between the peak level and the Miller plateau are set short. This reduces the switching loss.

Thus, in order to reduce the switching loss, the absolute values of the voltage gradients of the gate voltage Vgs of the waveform k2 during the periods t3 and t4 are set larger than the absolute values of the voltage gradients of the gate voltage Vgs of the waveform k1 during the periods t3 and t4, for example.

Next, switching patterns of the switches sw1 to sw6 when setting the gate voltage gradient will be described. Three switching patterns #1 to #3 will be described here. Also, FIG. 7 illustrates a relationship between the current values of the electric current sources I1 to I6. A table TL1 indicates the relationship of the current values of the electric current sources I1 to I6 in the respective patterns #1 to #3.

Figure 8:
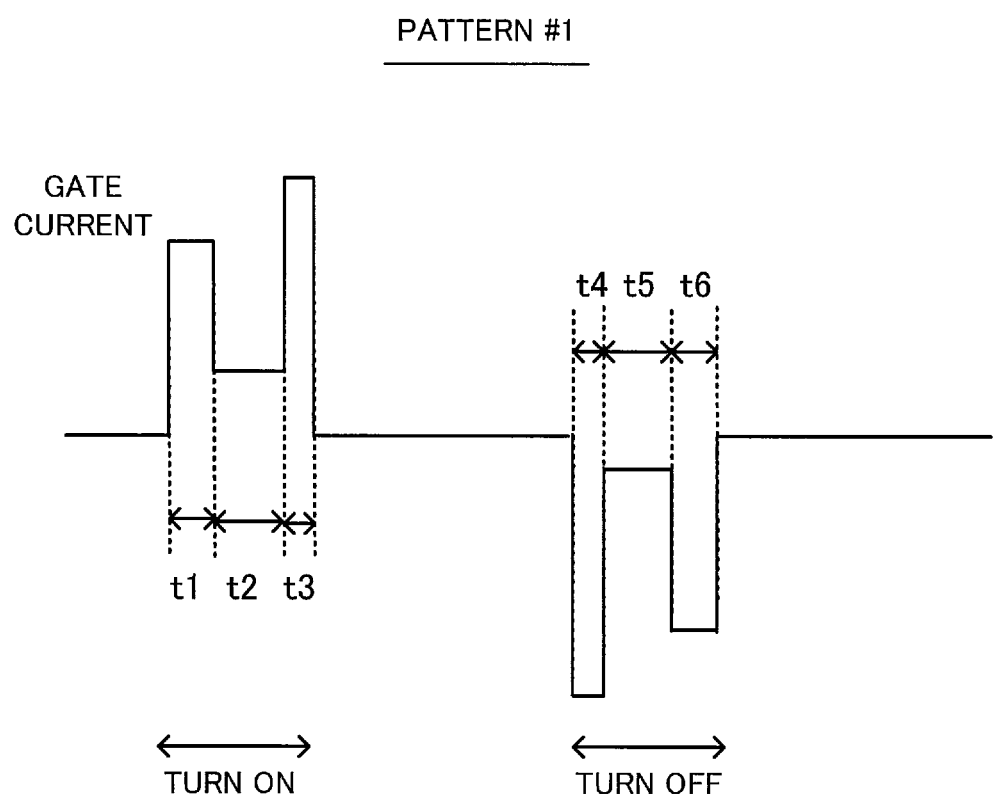
FIG. 8 illustrates a pattern #1 of gate current switching.

FIG. 8 illustrates the pattern #1 of gate current switching. At the time of turning on in the pattern #1, only the switch sw1 is turned on during the period t1; only the switch sw2 is turned on during the period t2; and only the switch sw3 is turned on during the period t3.

Also, as illustrated in the table TL1, the electric currents flowed by the electric current sources I1 to I3 of the turn-on side are set such that the electric current Igon2 is smaller than the electric currents Igon1 and Igon3 and that the electric current Igon1 is smaller than the electric current Igon3 (i.e., Igon2<Igon1<Igon3).

Thus, as illustrated in FIG. 8, the gate current IG of the switching element M2 is switched in the order of the electric current Igon1 (medium), the electric current Igon2 (small), and the electric current Igon3 (large).

On the other hand, at the time of turning off in the pattern #1, only the switch sw4 is turned on during the period t4; only the switch sw5 is turned on during the period t5; and only the switch sw6 is turned on during the period t6.

Also, as illustrated in the table TL1, the electric currents flowed by the electric current sources I4 to I6 of the turn-off side are set such that the electric current Igoff2 is smaller than the electric currents Igoff1 and Igoff3 and that the electric current Igoff1 is larger than the electric current Igoff3 (i.e., Igoff2<Igoff3<Igoff1).

Thus, as illustrated in FIG. 8, the gate current IG of the switching element M2 is switched in the order of the electric current Igoff1 (large), the electric current Igoff2 (small), and the electric current Igoff3 (medium).

Figure 9:
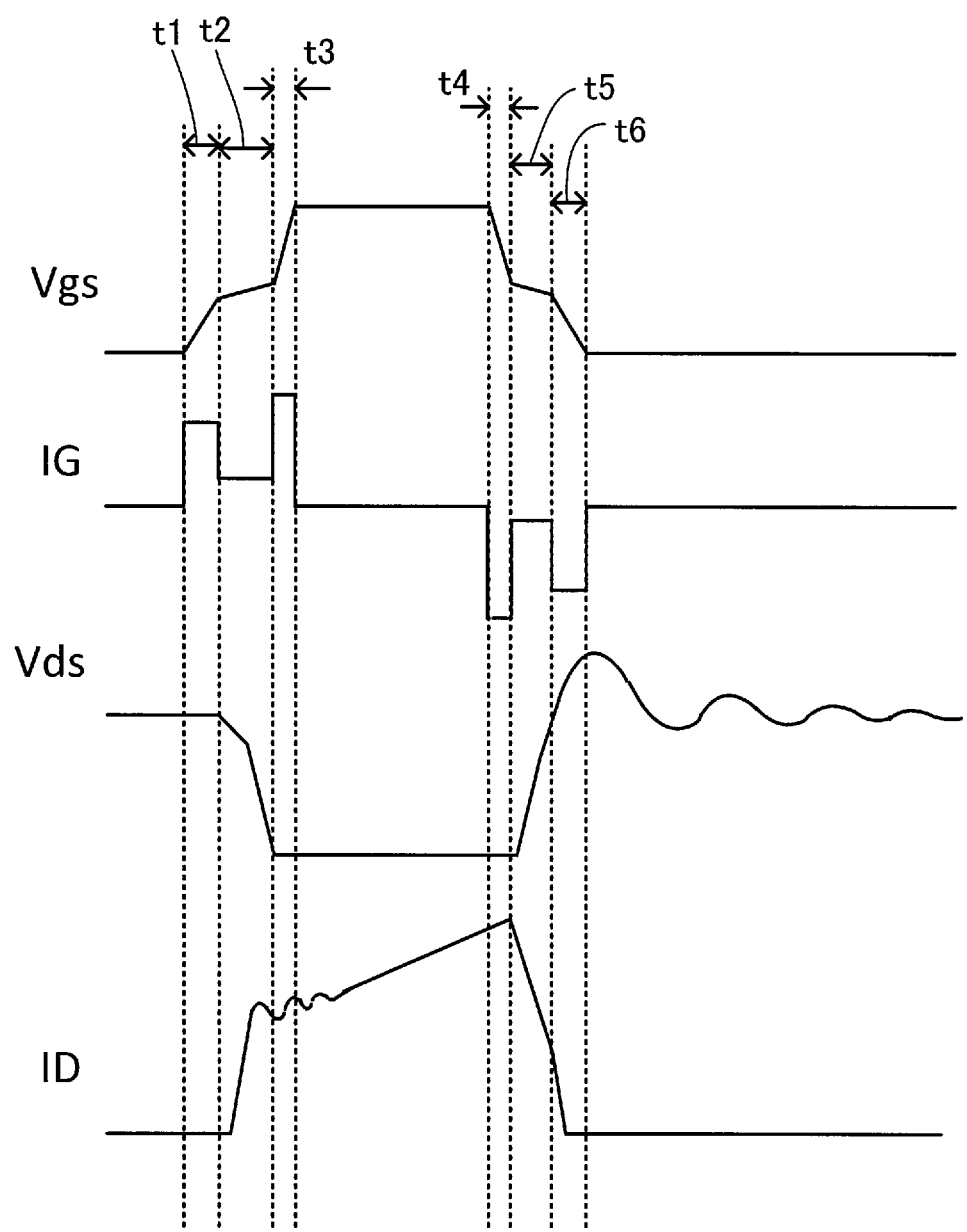
FIG. 9 illustrates operation waveforms of FIG. 8.

FIG. 9 illustrates operation waveforms of FIG. 8. FIG. 9 illustrates operation waveforms of the switching element M2 when the gate current IG is changed in the pattern #1.

[Period t1] The switch sw1 is turned on, and thereby the electric current Igon1 flows through the gate. The gate voltage Vgs rises at a voltage gradient according to the electric current Igon1.

[Period t2] The switch sw2 is turned on, and thereby the electric current Igon2 flows through the gate. The electric current Igon2 is smaller than the electric current Igon1, and therefore the voltage gradient during the period t2 is less steep than the voltage gradient during the period t1.

[Period t3] The switch sw3 is turned on, and thereby the electric current Igon3 flows through the gate. The electric current Igon3 is larger than the electric currents Igon1 and Igon2. Thus, the voltage gradient during the period t3 is steeper than the voltage gradients during the periods t1 and t2.

[Period t4] The switch sw4 is turned on, and thereby the electric current Igoff1 flows through the gate. The gate voltage Vgs falls at a voltage gradient according to the electric current Igoff1.

[Period t5] The switch sw5 is turned on, and thereby the electric current Igoff2 flows through the gate. The electric current Igoff2 is smaller than the electric current Igoff1, and therefore the voltage gradient during the period t5 is less steep than the voltage gradient during the period t4.

[Period t6] The switch sw6 is turned on, and thereby the electric current Igoff3 flows through the gate. The electric current Igoff3 is smaller than the electric current Igoff1 and is larger than the electric current Igoff2. Thus, the voltage gradient during the period t6 is less steep than the voltage gradient during the period t4 and is steeper than the voltage gradient during the period t5.

The voltage gradients of the gate voltage Vgs during the periods t2 and t5 corresponding to the Miller plateau are set less steep by the gate driving in this pattern #1, and thus the peaks of the surge voltage and the surge current are suppressed.

Also, the voltage gradients of the gate voltage Vgs during the periods t3 and t4 are set steeper. Thus, the period t3 between the Miller plateau and the peak level and the period t4 between the peak level and the Miller plateau are set short, and thus the switching loss is reduced.

Figure 10:
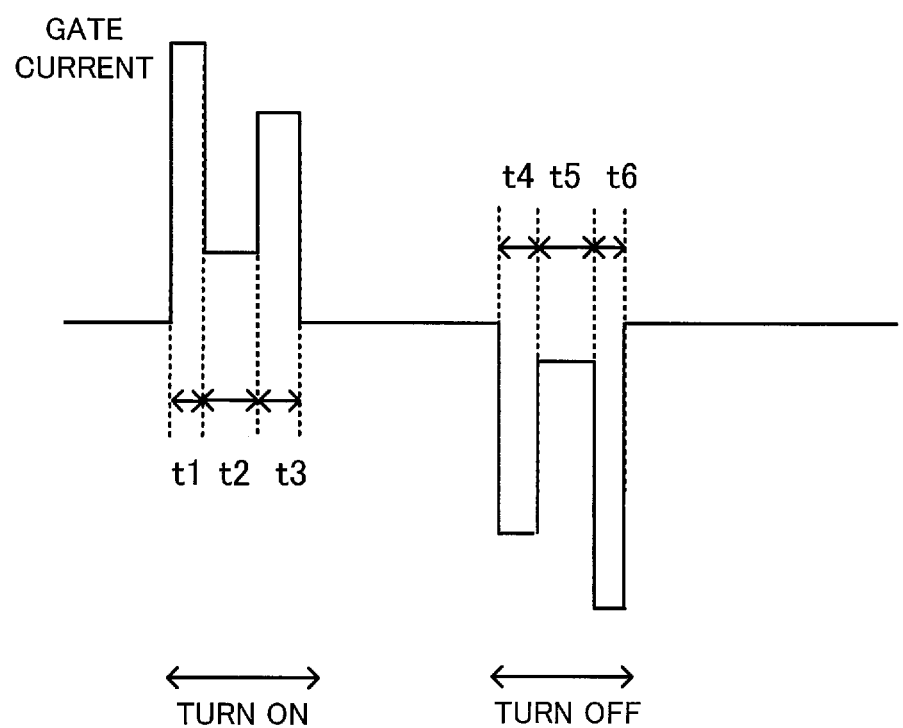
FIG. 10 illustrates a pattern of gate current switching of different magnitudes from FIG. 8.

FIG. 10 illustrates a switching pattern of gate current of different magnitudes from FIG. 8. At the time of turning on in the pattern #2, only the switch sw1 is turned on during the period t1; only the switch sw2 is turned on during the period t2; and only the switch sw3 is turned on during the period t3.

Note that, as illustrated in the table TL1, the electric currents flowed by the electric current sources I1 to I3 of the turn-on side are set such that the electric current Igon2 is smaller than the electric currents Igon1 and Igon3 and that the electric current Igon1 is larger than the electric current Igon3 (i.e., Igon2<Igon3<Igon1).

Thus, as illustrated in FIG. 10, the gate current IG of the switching element M2 is switched in the order of the electric current Igon1 (large), the electric current Igon2 (small), and the electric current Igon3 (medium).

On the other hand, at the time of turning off in the pattern #2, only the switch sw4 is turned on during the period t4; only the switch sw5 is turned on during the period t5; and only the switch sw6 is turned on during the period t6.

Also, as illustrated in the table TL1, the electric currents flowed by the electric current sources I4 to I6 of the turn-off side are set such that the electric current Igoff2 is smaller than the electric currents Igoff1 and Igoff3 and that the electric current Igoff1 is smaller than the electric current Igoff3 (i.e., Igoff2<Igoff1<Igoff3).

Thus, as illustrated in FIG. 10, the gate current IG of the switching element M2 is switched in the order of the electric current Igoff1 (medium), the electric current Igoff2 (small), and the electric current Igoff3 (large).

Figure 11:
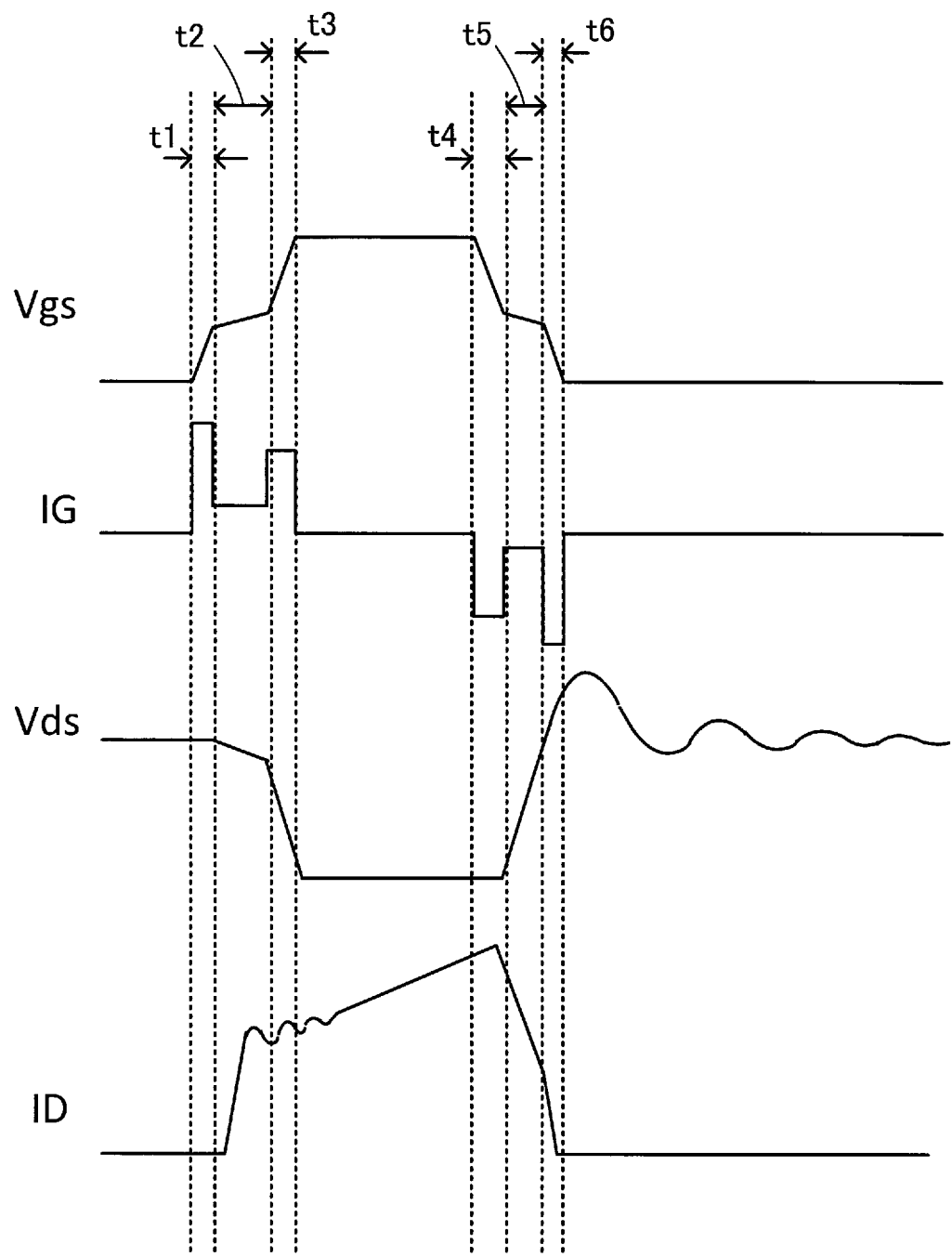
FIG. 11 illustrates operation waveforms of FIG. 10.

FIG. 11 illustrates operation waveforms of FIG. 10. FIG. 11 illustrates operation waveforms of the switching element M2 when the gate current IG is changed in the pattern #2.

[Period t1] The switch sw1 is turned on, and thereby the electric current Igon1 flows through the gate. The gate voltage Vgs rises at a voltage gradient according to the electric current Igon1.

[Period t2] The switch sw2 is turned on, and thereby the electric current Igon2 flows through the gate. The electric current Igon2 is smaller than the electric current Igon1, and therefore the voltage gradient during the period t2 is less steep than the voltage gradient during the period t1.

[Period t3] The switch sw3 is turned on, and thereby the electric current Igon3 flows through the gate. The electric current Igon3 is smaller than the electric current Igon1 and is larger than the electric current Igon2. Thus, the voltage gradient during the period t3 is less steep than the voltage gradient during the period t1 and is steeper than the voltage gradient during the period t2.

[Period t4] The switch sw4 is turned on, and thereby the electric current Igoff1 flows through the gate. The gate voltage Vgs falls at a voltage gradient according to the electric current Igoff1.

[Period t5] The switch sw5 is turned on, and thereby the electric current Igoff2 flows through the gate. The electric current Igoff2 is smaller than the electric current Igoff1, and therefore the voltage gradient during the period t5 is less steep than the voltage gradient during the period t4.

[Period t6] The switch sw3 is turned on, and thereby the electric current Igoff3 flows through the gate. The electric current Igoff3 is larger than the electric currents Igoff1 and Igoff2. Thus, the voltage gradient during the period t6 is steeper than the voltage gradients during the periods t4 and t5.

The voltage gradients of the gate voltage Vgs during the periods t2 and t5 corresponding to the Miller plateau are set less steep by gate driving in the pattern #2, and thus the peaks of the surge voltage and the surge current are suppressed.

Also, the voltage gradients of the gate voltage Vgs during the periods t1 and t6 are set steeper. Thus, the period t1 between the rising edge start point and the Miller plateau and the period t6 between the Miller plateau and the bottom level are set short.

Hence, the simultaneous turned-off period of the switching elements M1 and M2 is made shorter. Note that switching loss is also reduced.

Figure 12:
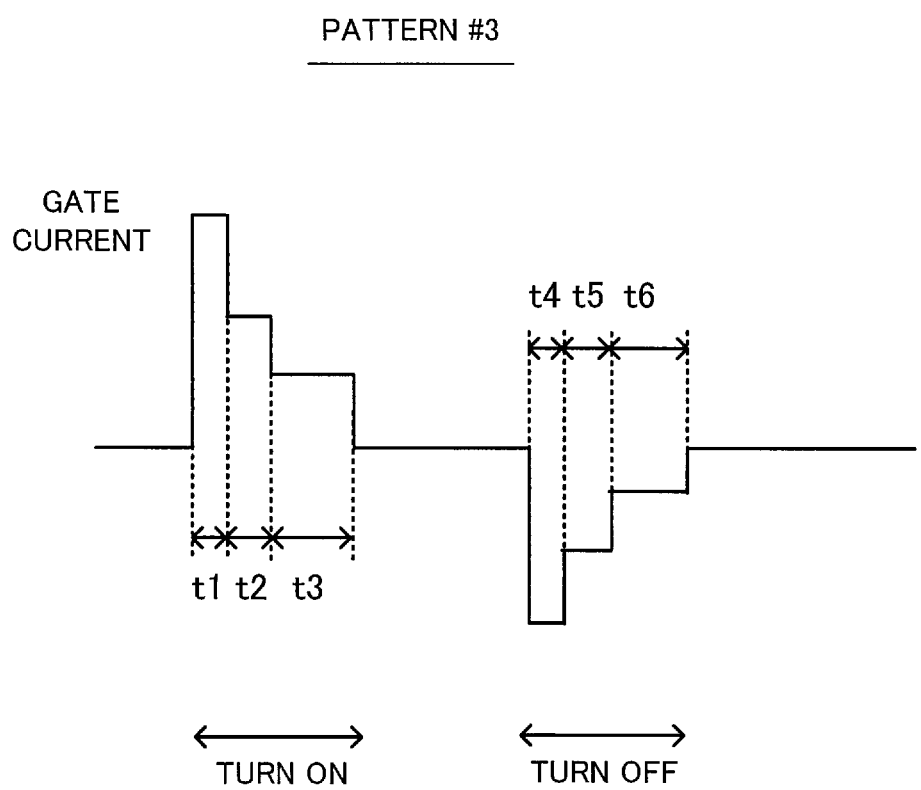
FIG. 12 illustrates a pattern of gate current switching of different magnitudes from FIGS. 8 and 10.

FIG. 12 illustrates a switching pattern of gate current of different magnitudes from FIGS. 8 and 10. At the time of turning on in the pattern #3, only the switch sw1 is turned on during the period t1; only the switch sw2 is turned on during the period t2; and only the switch sw3 is turned on during the period t3.

Note that, as illustrated in the table TL1, the electric currents flowed by the electric current sources I1 to I3 of the turn-on side are set such that the electric current Igon1 is larger than the electric current Igon2 and that the electric current Igon2 is larger than the electric current Igon3.

Thus, as illustrated in FIG. 12, the gate current IG of the switching element M2 is switched in the order of the electric current Igon1 (large), the electric current Igon2 (medium), and the electric current Igon3 (small).

On the other hand, at the time of turning off in the pattern #3, only the switch sw4 is turned on during the period t4; only the switch sw5 is turned on during the period t5; and only the switch sw6 is turned on during the period t6.

Also, as illustrated in the table TL1, the electric currents flowed by the electric current sources I4 to I6 of the turn-off side are set such that the electric current Igoff1 is larger than the electric current Igoff2 and that the electric current Igoff2 is larger than the electric current Igoff3.

Thus, as illustrated in FIG. 12, the gate current IG of the switching element M2 is switched in the order of the electric current Igoff1 (large), the electric current Igoff2 (medium), and the electric current Igoff3 (small).

Figure 13:
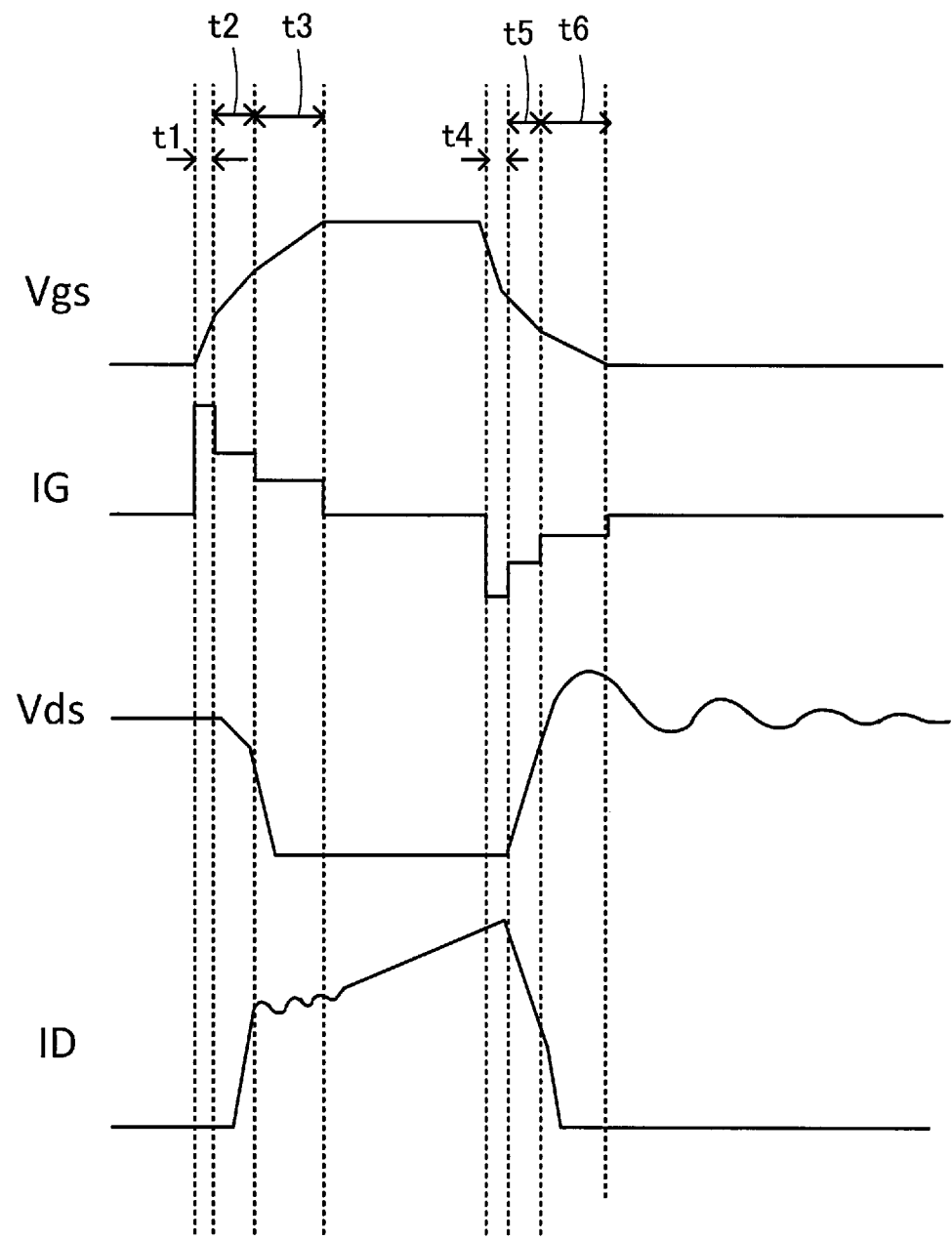
FIG. 13 illustrates operation waveforms of FIG. 12.

FIG. 13 illustrates operation waveforms of FIG. 12. FIG. 13 illustrates operation waveforms of the switching element M2 when the gate current IG is changed in the pattern #3.

[Period t1] The switch sw1 is turned on, and thereby the electric current Igon1 flows through the gate. The gate voltage Vgs rises at a voltage gradient according to the electric current Igon1.

[Period t2] The switch sw2 is turned on, and thereby the electric current Igon2 flows through the gate. The electric current Igon2 is smaller than the electric current Igon1, and therefore the voltage gradient during the period t2 is less steep than the voltage gradient during the period t1.

[Period t3] The switch sw3 is turned on, and thereby the electric current Igon3 flows through the gate. The electric current Igon3 is smaller than the electric currents Igon1 and Igon2, and therefore the voltage gradient during the period t3 is less steep than the voltage gradients during the periods t1 and t2.

[Period t4] The switch sw4 is turned on, and thereby the electric current Igoff1 flows through the gate. The gate voltage Vgs falls at a voltage gradient according to the electric current Igoff1.

[Period t5] The switch sw5 is turned on, and thereby the electric current Igoff2 flows through the gate. The electric current Igoff2 is smaller than the electric current Igoff1, and therefore the voltage gradient during the period t5 is less steep than the voltage gradient during the period t4.

[Period t6] The switch sw3 is turned on, and thereby the electric current Igoff3 flows through the gate. The electric current Igoff3 is smaller than the electric currents Igoff1 and Igoff2, and therefore the voltage gradient during the period t6 is less steep than the voltage gradients during the periods t4 and t5.

The voltage gradients of the gate voltage Vgs during the periods t2 and t5 corresponding to the Miller plateau are set less steep by gate driving in the pattern #3, and thus the peaks of the surge voltage and the surge current are suppressed.

Also, the voltage gradients of the gate voltage Vgs during the periods t3 and t6 are also set less steep, and thus oscillation of the surge voltage generated in the drain voltage Vds and oscillation of the surge current generated in the drain current ID are suppressed.

Next, overvoltage suppression control by switching the switches will be described. When a switching element is turned off, the drain voltage Vds exceeds a recommended voltage level for a certain amount of time in an overvoltage state, in some cases. Note that the surge voltage is an instantaneously spiking peak voltage, but the overvoltage is different from the surge voltage and exceeds a predetermined level for a certain amount of time. The occurrence of overvoltage as well as the surge voltage may cause destruction and malfunction of elements, and therefore the present embodiment suppresses the overvoltage by switching the switches.

Figure 14:
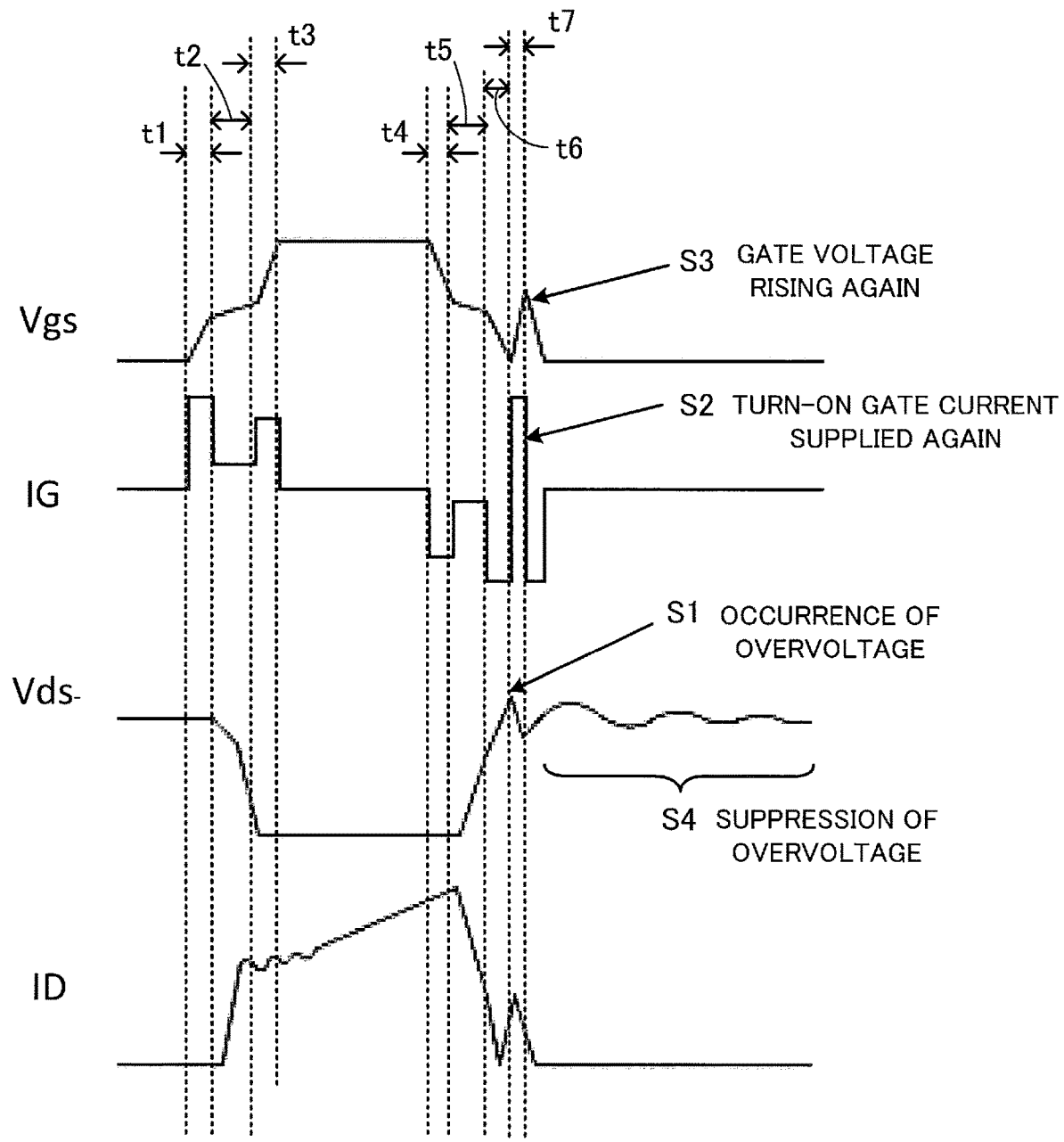
FIG. 14 illustrates operation waveforms when overvoltage is suppressed.

FIG. 14 illustrates operation waveforms when overvoltage is suppressed. When the switches are switched in the above pattern #2 for the purpose of turning off, an overvoltage occurs in the drain voltage Vds, and the overvoltage is suppressed during the period t7.

[S1] The monitor circuit 21 illustrated in FIG. 4 detects that the drain voltage Vds exceeds a threshold value for a certain amount of time to cause an overvoltage, when the switching element M2 is turned off.

[S2] When the overvoltage is detected, the switch sw1 is turned on to cause the electric current source I1 to flow the electric current Igon1 through the gate of the switching element M2, in order to supply the turn-on gate current to the gate again.

Note that one of the switches sw2 and sw3 may be turned on to flow the gate current from the electric current source I2 or the electric current source I3, and a plurality of switches may be turned on to flow the gate current from a plurality of electric current sources.

[S3] The electric current Igon1 flows through the gate of the switching element M2, and thereby the gate voltage Vgs of the switching element M2 rises again.

[S4] The gate voltage Vgs rises again to flow the drain current ID again, and thus the drain voltage Vds drops to suppress the overvoltage.

As described above, when the overvoltage that occurs in the drain voltage Vds is detected when the switching element is turned off, one of the switches sw1 to sw3 provided at the turn-on side is turned on to cause the gate voltage Vgs to rise again. This suppresses the overvoltage.

Figure 15:
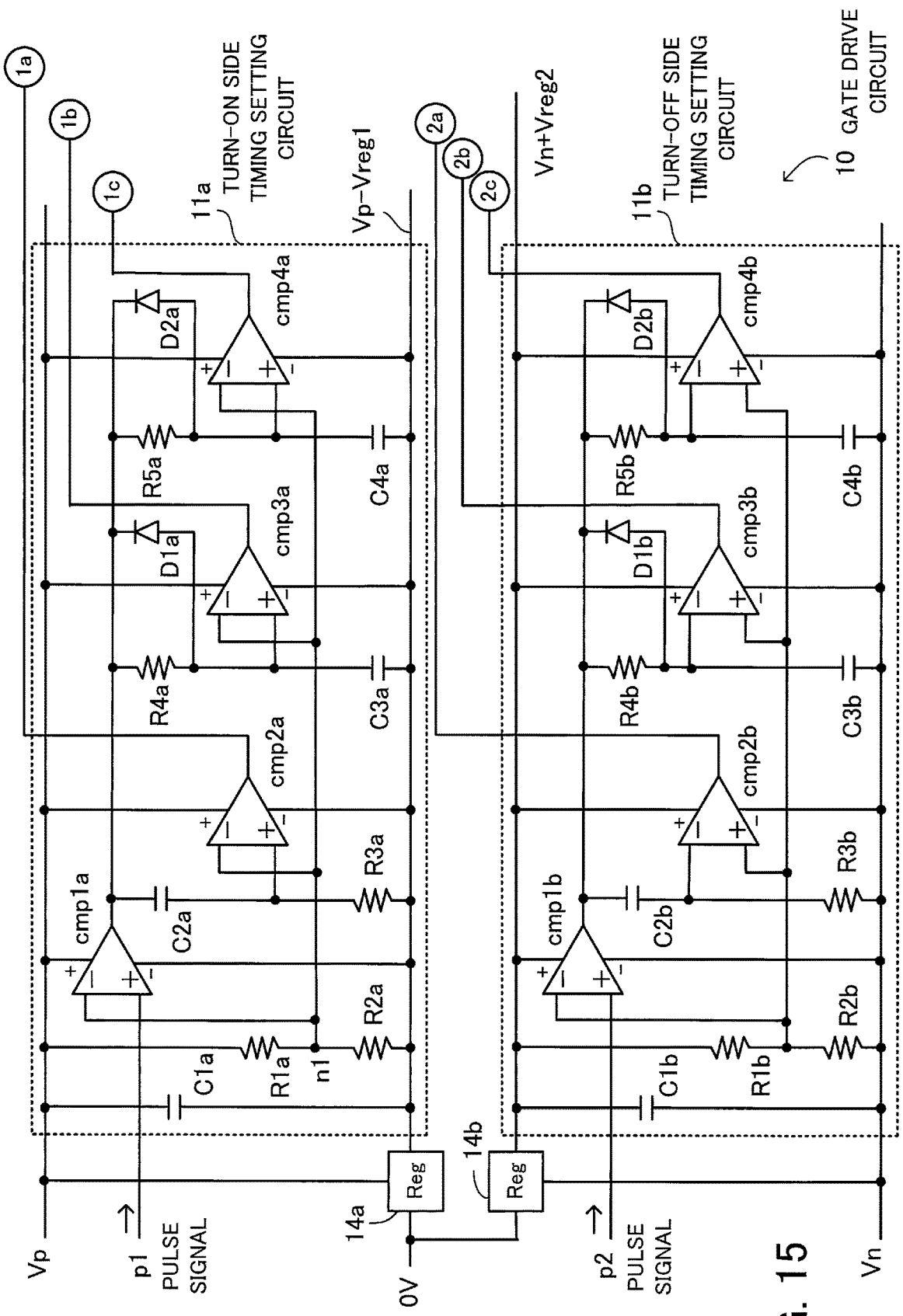
FIG. 15 illustrates an example of a former stage of a specific configuration of a gate drive circuit.
Figure 16:
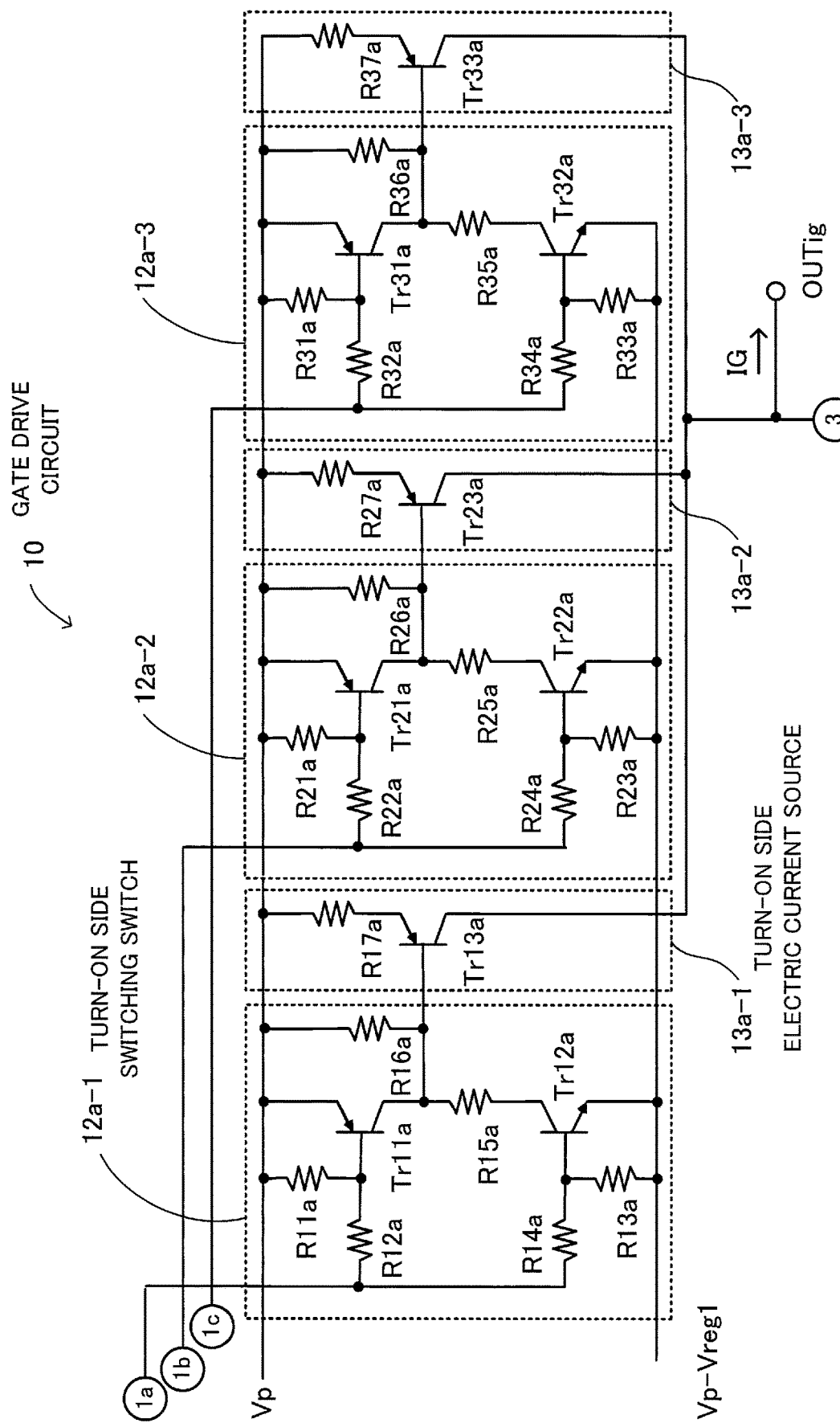
FIG. 16 illustrates an example of a latter stage turn-on side of a specific configuration of a gate drive circuit.
Figure 17:
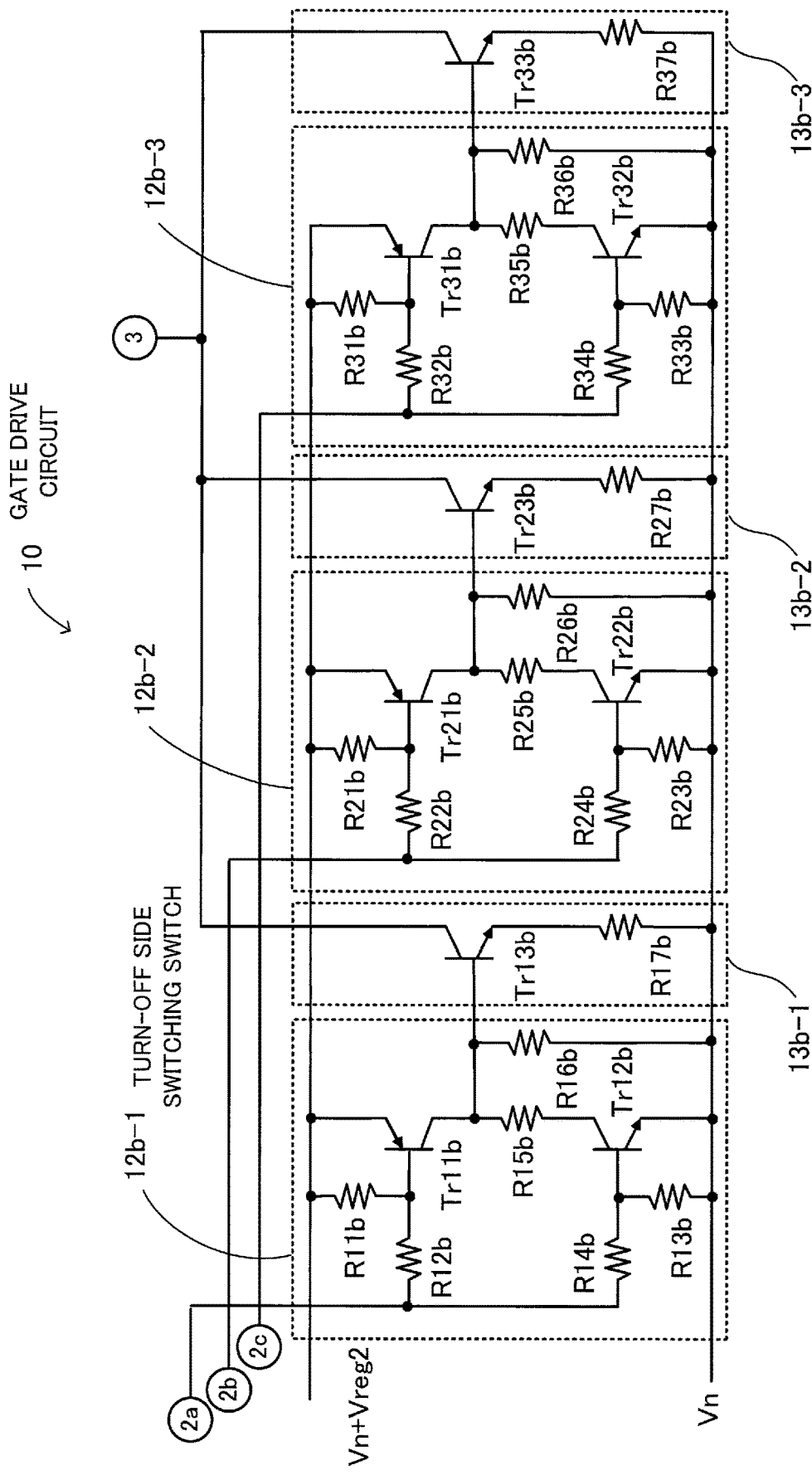
FIG. 17 illustrates an example of a latter stage turn-off side of a specific configuration of a gate drive circuit.

Next, a specific circuit configuration of a gate drive circuit will be described. FIGS. 15 to 17 illustrate examples of a specific circuit configuration of a gate drive circuit. A gate drive circuit 10 includes a turn-on side timing setting circuit 11a, a turn-off side timing setting circuit 11b, turn-on side switching switches 12a-1 to 12a-3, turn-off side switching switches 12b-1 to 12b-3, turn-on side electric current sources 13a-1 to 13a-3, turn-off side electric current sources 13b-1 to 13b-3, and regulators 14a and 14b.

Note that the regulators 14a and 14b are three-terminal regulators. In the regulator 14a, 0 V is applied to a common terminal; a positive electrode power supply Vp is applied to an input terminal; and a power-supply voltage (Vp−Vreg1) is output from an output terminal.

Also, in the regulator 14b, 0 V is applied to the common terminal; a negative electrode power supply Vn is applied to an input terminal; and a power-supply voltage (Vn+Vreg2) is output from an output terminal.

In the circuit of the turn-on side, the turn-on side timing setting circuit 11a includes resistors R1a to R5a, capacitors C1a to C4a, diodes D1a and D2a, and comparators cmp1a to cmp4a.

The turn-on side switching switch 12a-1 includes resistors R11a to R16a and transistors Tr11a and Tr12a. A PNP transistor is used as the transistor Tr11a, and an NPN transistor is used as the transistor Tr12a.

The turn-on side switching switch 12a-2 includes resistors R21a to R26a and transistors Tr21a and Tr22a. A PNP transistor is used as the transistor Tr21a, and an NPN transistor is used as the transistor Tr22a.

The turn-on side switching switch 12a-3 includes resistors R31a to R36a and transistors Tr31a and Tr32a. A PNP transistor is used as the transistor Tr31a, and an NPN transistor is used as the transistor Tr32a.

The turn-on side electric current source 13a-1 includes a resistor R17a and a transistor Tr13a. The turn-on side electric current source 13a-2 includes a resistor R27a and a transistor Tr23a. The turn-on side electric current source 13a-3 includes a resistor R37a and a transistor Tr33a. PNP transistors are used as the transistors Tr13a, Tr23a, and Tr33a.

In the circuit of the turn-off side, the turn-off side timing setting circuit 11b includes resistors R1b to R5b, capacitors C1b to C4b, diodes D1b and D2b, and comparators cmp1b to cmp4b.

The turn-off side switching switch 12b-1 includes resistors R11b to R16b and transistors Tr11b and Tr12b. A PNP transistor is used as the transistor Tr11b, and an NPN transistor is used as the transistor Tr12b.

The turn-off side switching switch 12b-2 includes resistors R21b to R26b and transistors Tr21b and Tr22b. A PNP transistor is used as the transistor Tr21b, and an NPN transistor is used as the transistor Tr22b.

The turn-off side switching switch 12b-3 includes resistors R31b to R36b and transistors Tr31b and Tr32b. A PNP transistor is used as the transistor Tr31b, and an NPN transistor is used as the transistor Tr32b.

The turn-off side electric current source 13b-1 includes a resistor R17b and a transistor Tr13b. The turn-off side electric current source 13b-2 includes a resistor R27b and a transistor Tr23b. The turn-off side electric current source 13b-3 includes a resistor R37b and a transistor Tr33b. NPN transistors are used as the transistors Tr13b, Tr23b, and Tr33b.

A connection relationship between elements will be described with reference to each drawing. In the connection relationship of the turn-on side circuit of FIG. 15, the positive electrode power supply Vp is connected to the input terminal of the regulator 14a, one end of the capacitor C1a, one end of the resistor R1a, and positive electrode power supply terminals of the comparators cmp1a to cmp4a.

A pulse signal p1 is input into a positive input terminal of the comparator cmp1a, and a negative input terminal of the comparator cmp1a is connected to negative input terminals of the comparators cmp2a to cmp4a, the other end of the resistor R1a, and one end of the resistor R2a.

An output terminal of the comparator cmp1a is connected to one end of the capacitor C2a, ends of the resistors R4a and R5a, and the cathodes of the diodes D1a and D2a.

A positive input terminal of the comparator cmp2a is connected to the other end of the capacitor C2a and one end of the resistor R3a. A positive input terminal of the comparator cmp3a is connected to the other end of the resistor R4a, the anode of the diode D1a, and one end of the capacitor C3a. A positive input terminal of the comparator cmp4a is connected to the other end of the resistor R5a, the anode of the diode D2a, and one end of the capacitor C4a.

The power-supply voltage (Vp−Vreg1) output from the regulator 14a is connected to the other ends of the capacitors C1a, C3a, and C4a, the other ends of the resistors R2a and R3a, and negative electrode power supply terminals of the comparators cmp1a to cmp4a.

An output terminal of the comparator cmp2a is connected to ends of the resistors R12a and R14a in the turn-on side switching switch 12a-1 illustrated in FIG. 16. An output terminal of the comparator cmp3a is connected to ends of the resistors R22a and R24a in the turn-on side switching switch 12a-2 illustrated in FIG. 16. An output terminal of the comparator cmp4a is connected to ends of the resistors R32a and R34a in the turn-on side switching switch 12a-3 illustrated in FIG. 16.

In the connection relationship of the turn-off side circuit of FIG. 15, the power-supply voltage (Vn+Vreg2) output from the regulator 14b is connected to one end of the capacitor C1b, one end of the resistor R1b, and positive electrode power supply terminals of the comparators cmp1b to cmp4b.

A pulse signal p2 is input into a positive input terminal of the comparator cmp1b, and a negative input terminal of the comparator cmp1b is connected to positive input terminals of the comparators cmp2b to cmp4b, the other end of the resistor R1b, and one end of the resistor R2b.

An output terminal of the comparator cmp1b is connected to one end of the capacitor C2b, ends of the resistors R4b and R5b, and the cathodes of the diodes D1b and D2b.

A negative input terminal of the comparator cmp2b is connected to the other end of the capacitor C2b and one end of the resistor R3b. A negative input terminal of the comparator cmp3b is connected to the other end of the resistor R4b, the anode of the diode D1b, and one end of the capacitor C3b. A negative input terminal of the comparator cmp4b is connected to the other end of the resistor R5b, the anode of the diode D2b, and one end of the capacitor C4b.

The negative electrode power supply Vn is connected to an input terminal of the regulator 14b, the other ends of the capacitors C1b, C3b, and C4b, the other ends of the resistors R2b and R3b, and the negative electrode power supply terminals of the comparators cmplb to cmp4b.

An output terminal of the comparator cmp2b is connected to ends of the resistors R12b and R14b in the turn-off side switching switch 12b-1 illustrated in FIG. 17. An output terminal of the comparator cmp3b is connected to ends of the resistors R22b and R24b in the turn-off side switching switch 12b-2 illustrated in FIG. 17. An output terminal of the comparator cmp4b is connected to ends of the resistors R32b and R34b in the turn-off side switching switch 12b-3 illustrated in FIG. 17.

In the connection relationship of the turn-on side circuit of FIG. 16, the positive electrode power supply Vp is connected to the resistors R11a, R21a, R31a, R16a, R26a, R36a, R17a, R27a, and R37a and the emitters of the transistors Tr11a, Tr21a, and Tr31a.

The base of the transistor Tr11a is connected to the other end of the resistor R11a and the other end of the resistor R12a, and the base of the transistor Tr12a is connected to the other end of the resistor R14a and one end of the resistor R13a.

The collector of the transistor Tr11a is connected to one end of the resistor R15a, the other end of the resistor R16a, and the base of the transistor Tr13a; the collector of the transistor Tr12a is connected to the other end of the resistor R15a; and the emitter of the transistor Tr13a is connected to the other end of the resistor R17a.

The base of the transistor Tr21a is connected to the other end of the resistor R21a and the other end of the resistor R22a, and the base of the transistor Tr22a is connected to the other end of the resistor R24a and one end of the resistor R23a.

The collector of the transistor Tr21a is connected to one end of the resistor R25a, the other end of the resistor R26a, and the base of the transistor Tr23a; the collector of the transistor Tr22a is connected to the other end of the resistor R25a; and the emitter of the transistor Tr23a is connected to the other end of the resistor R27a.

The base of the transistor Tr31a is connected to the other end of the resistor R31a and the other end of the resistor R32a, and the base of the transistor Tr32a is connected to the other end of the resistor R34a and one end of the resistor R33a.

The collector of the transistor Tr31a is connected to one end of the resistor R35a, the other end of the resistor R36a, and the base of the transistor Tr33a; the collector of the transistor Tr32a is connected to the other end of the resistor R35a; and the emitter of the transistor Tr33a is connected to the other end of the resistor R37a.

The power-supply voltage (Vp−Vrge1) is connected to the other ends of the resistors R13a, R23a, and R33a and the emitters of the transistors Tr12a, Tr22a, and Tr32a. A gate current output terminal OUTig is connected to the collectors of the transistors Tr13a, Tr23a, and Tr33a. Further, the gate current output terminal OUTig is connected to the collectors of the transistors Tr13b, Tr23b, and Tr33b in the turn-off side electric current sources 13b-1 to 13b-3 illustrated in FIG. 17.

In the connection relationship of the turn-off side circuit of FIG. 17, the power-supply voltage (Vn+Vreg2) is connected to the resistors R11b, R21b, and R31b and the emitters of the transistors Tr11b, Tr21b, and Tr31b.

The base of the transistor Tr11b is connected to the other end of the resistor R11b and the other end of the resistor R12b, and the base of the transistor Tr12b is connected to the other end of the resistor R14b and one end of the resistor R13b.

The collector of the transistor Tr11b is connected to one end of the resistor R15b, one end of the resistor R16b, and the base of the transistor Tr13b; the collector of the transistor Tr12b is connected to the other end of the resistor R15b; and the emitter of the transistor Tr13b is connected to one end of the resistor R17b.

The base of the transistor Tr21b is connected to the other end of the resistor R21b and the other end of the resistor R22b, and the base of the transistor Tr22b is connected to the other end of the resistor R24b and one end of the resistor R23b.

The collector of the transistor Tr21b is connected to one end of the resistor R25b, one end of the resistor R26b, and the base of the transistor Tr23b; the collector of the transistor Tr22b is connected to the other end of the resistor R25b; and the emitter of the transistor Tr23b is connected to one end of the resistor R27b.

The base of the transistor Tr31b is connected to the other end of the resistor R31b and the other end of the resistor R32b, and the base of the transistor Tr32b is connected to the other end of the resistor R34b and one end of the resistor R33b.

The collector of the transistor Tr31b is connected to one end of the resistor R35b, one end of the resistor R36b, and the base of the transistor Tr33b; the collector of the transistor Tr32b is connected to the other end of the resistor R35b; and the emitter of the transistor Tr33b is connected to one end of the resistor R37b.

The power-supply voltage Vn is connected to the other ends of the resistors R13b, R23b, and R33b, the other ends of the resistors R16b, R26b, and R36b, the other ends of the resistors R17b, R27b, and R37b, and the emitters of the transistors Tr12b, Tr22b, and Tr32b.

Here, in the turn-on side timing setting circuit 11a illustrated in FIG. 15, a voltage obtained by dividing the power-supply voltage Vp by the resistors R1a and R2a is input in the negative input terminals of the comparators cmp1a to cmp1a. Also, the capacitor C2a and the resistor R3a compose a differentiation circuit to differentiate the output signal of the comparator cmp1a, and a differential signal is input into the positive input terminal of the comparator cmp2a.

On the other hand, the resistor R4a and the capacitor C3a compose an integration circuit to integrate the output signal of the comparator cmp1a, and an integrated signal is input into the positive input terminal of the comparator cmp3a.

Further, the resistor R5a and the capacitor C4a compose an integration circuit to integrate the output signal of the comparator cmp1a, and an integrated signal is input into the positive input terminal of the comparator cmp4a.

In the turn-off side timing setting circuit 11b, a voltage obtained by dividing the power-supply voltage Vn by the resistors R1b and R2b is input into the negative input terminal of the comparator cmp1b and the positive input terminals of the comparators cmp2b to cmp4b. Also, the capacitor C2b and the resistor R3b compose a differentiation circuit to differentiate the output signal of the comparator cmp1b, and a differential signal is input into the negative input terminal of the comparator cmp2b.

On the other hand, the resistor R4b and the capacitor C3b compose an integration circuit to integrate the output signal of the comparator cmp1b, and an integrated signal is input into the negative input terminal of the comparator cmp3b.

Further, the resistor R5b and the capacitor C4b compose an integration circuit to integrate the output signal of the comparator cmp1b, and an integrated signal is input into the negative input terminal of the comparator cmp4b.

Figure 18:
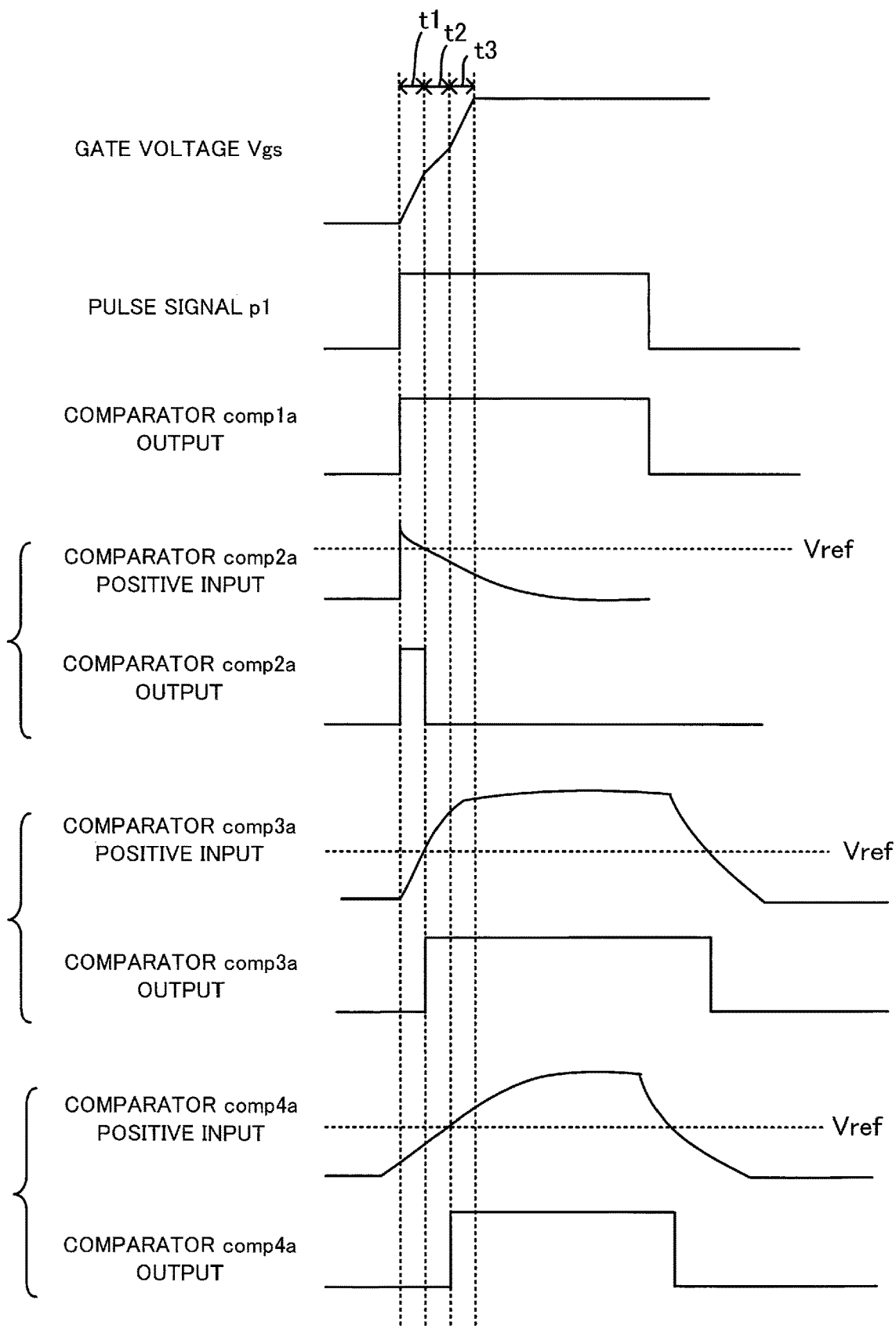
FIG. 18 illustrates operation waveforms of a turn-on side timing setting circuit.

FIG. 18 illustrates operation waveforms of the turn-on side timing setting circuit. Note that the operation of the turn-on side timing setting circuit 11a is basically same as the operation of the turn-off side timing setting circuit 11b except for inverse output polarities of the comparators cmp2b to cmp4b, and therefore the operation waveform of the turn-on side timing setting circuit 11a will be described.

First, a pulse signal p1 that oscillates between Vp−Vreg1 and Vp (which are different by 3 V, for example) is input. A voltage dividing point n1 illustrated in FIG. 15 is Vp−(Vreg1/2), which is a reference voltage Vref, and the comparator cmp1 outputs Vp−Vreg1 or Vp.

(During Period t1)

The pulse signal p1 is input and rises from L level to H level. Also, the output signal of the comparator cmp1a rises from L level to H level in synchronization with the pulse signal p1.

Also, the differentiation circuit composed of the capacitor C2a and the resistor R3a differentiates the output signal of the comparator cmp1a and outputs a differentiation waveform that is H level during the period t1.

This differentiation signal is input into the positive input terminal of the comparator cmp2a, and the reference voltage Vref is input into the negative input terminal of the comparator cmp2a. The level of the positive input signal of the comparator cmp2a exceeds the reference voltage Vref, and thus the comparator cmp2a outputs an H-level signal.

On the other hand, the integration circuit composed of the resistor R4a and the capacitor C3a integrates the output signal of the comparator cmp1a and outputs an integration waveform that rises at a time constant decided by the resistance value of the resistor R4a and the capacitance value of the capacitor C3a.

This integration signal is input into the positive input terminal of the comparator cmp3a, and the reference voltage Vref is input into the negative input terminal of the comparator cmp3a. The level of the positive input signal of the comparator cmp3a does not exceed the reference voltage Vref, and thus the comparator cmp3a outputs an L-level signal.

Further, the integration circuit composed of the resistor R5a and the capacitor C4a integrates the output signal of the comparator cmp1a and outputs an integration waveform that rises at a time constant decided by the resistance value of the resistor R5a and the capacitance value of the capacitor C4a.

This integration signal is input into the positive input terminal of the comparator cmp4a, and the reference voltage Vref is input into the negative input terminal of the comparator cmp4a. The level of the positive input signal of the comparator cmp4a does not exceed the reference voltage Vref, and thus the comparator cmp4a outputs an L-level signal.

(During Period t2)

The pulse signal p1 is H level, and the output signal of the comparator cmp1a is H level. The level of the positive input signal of the comparator cmp2a is lower than the reference voltage Vref, and thus the comparator cmp2a outputs an L-level signal.

On the other hand, the integration waveform output from the integration circuit composed of the resistor R4a and the capacitor C3a, which is the positive input signal of the comparator cmp3a, exceeds the reference voltage Vref. Thus, the comparator cmp3a outputs an H-level signal.

Also, the integration waveform output from the integration circuit composed of the resistor R5a and the capacitor C4a, which is the positive input signal of the comparator cmp4a, does not exceed the reference voltage Vref. Thus, the comparator cmp4a outputs an L-level signal.

(During Period t3)

The pulse signal p1 is H level, and the output signal of the comparator cmp1a is H level. The level of the positive input signal of the comparator cmp2a is lower than the reference voltage Vref, and thus the comparator cmp2a outputs an L-level signal.

On the other hand, the integration waveform output from the integration circuit composed of the resistor R4a and the capacitor C3a, which is the positive input signal of the comparator cmp3a, exceeds the reference voltage Vref. Thus, the comparator cmp3a outputs an H-level signal.

Further, the integration waveform output from the integration circuit composed of the resistor R5a and the capacitor C4a, which is the positive input signal of the comparator cmp4a, exceeds the reference voltage Vref. Thus, the comparator cmp4a outputs an H-level signal.

As described above, during the periods t1 to t3, the turn-on side timing setting circuit 11a generates pulses for driving the turn-on side switching switches 12a-1 to 12a-3, to flow the gate current from the turn-on side electric current sources 13a-1 to 13a-3 at predetermined time points, thereby setting the rising edge voltage gradients. Timing setting for setting the falling edge voltage gradients is the same operation.

Figure 19:
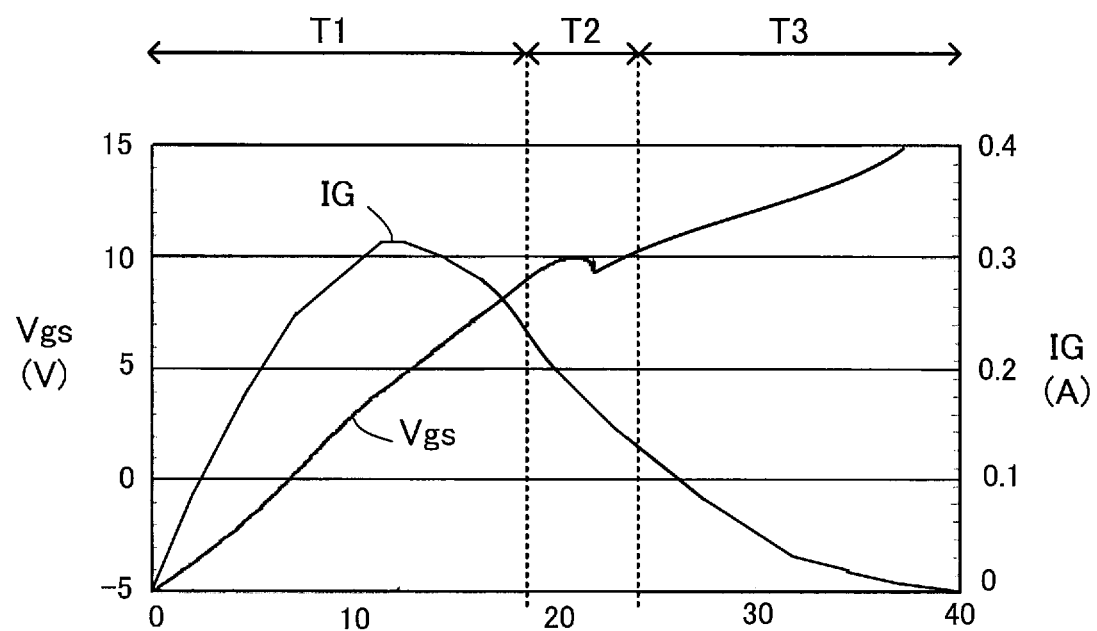
FIG. 19 illustrates simulated operation waveforms at the time of turning on of gate driving by a resistor of a conventional technology.
Figure 20:
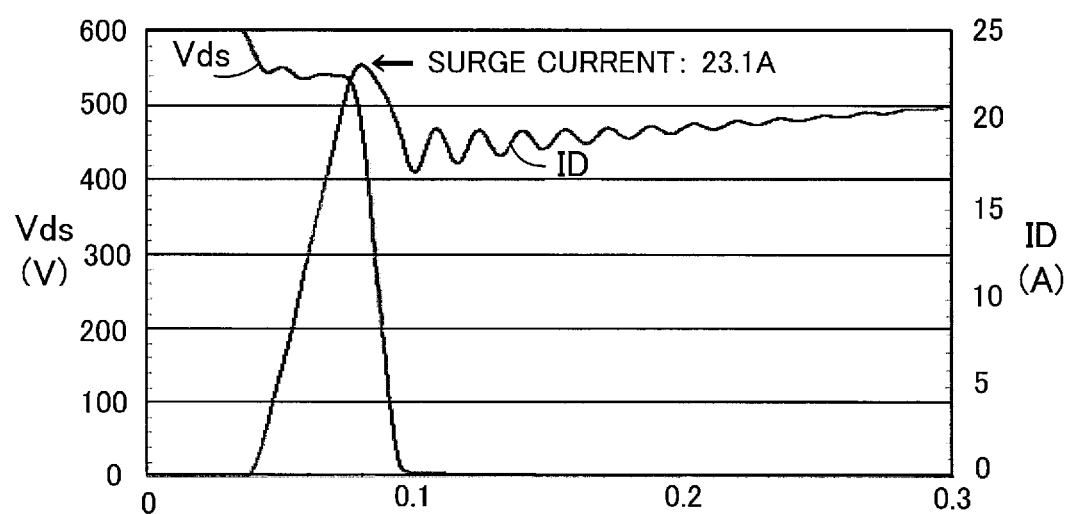
FIG. 20 illustrates simulated operation waveforms at the time of turning on of gate driving by a resistor of a conventional technology.

Next, a simulation result will be described with reference to FIGS. 19 to 26. FIGS. 19 and 20 illustrate simulated operation waveforms of the conventional configuration at the time of turning on of the gate driving by the resistor of the conventional technology.

FIG. 19 illustrates waveforms of the gate voltage Vgs and the gate current IG at the time of turning on, with the horizontal axis representing time, the left vertical axis representing the gate voltage Vgs (V), and the right vertical axis representing the gate current IG (A).

A period T1 begins at a bottom level of the gate voltage Vgs and ends at a Miller plateau during rising. A period T2 includes the Miller plateau during rising of the gate voltage Vgs. A period T3 begins at a time point at which the gate voltage Vgs goes out from the Miller plateau during rising and ends at a time point at which the gate voltage Vgs reaches a peak level.

FIG. 20 illustrates waveforms of the drain voltage Vds and the drain current ID at the time of turning on, with the horizontal axis representing time, the left vertical axis representing the drain voltage Vds (V), and the right vertical axis representing the drain current ID (A). Surge current having a peak of 23.1 A is generated in the drain current ID at the falling edge of the drain voltage Vds.

Figure 21:
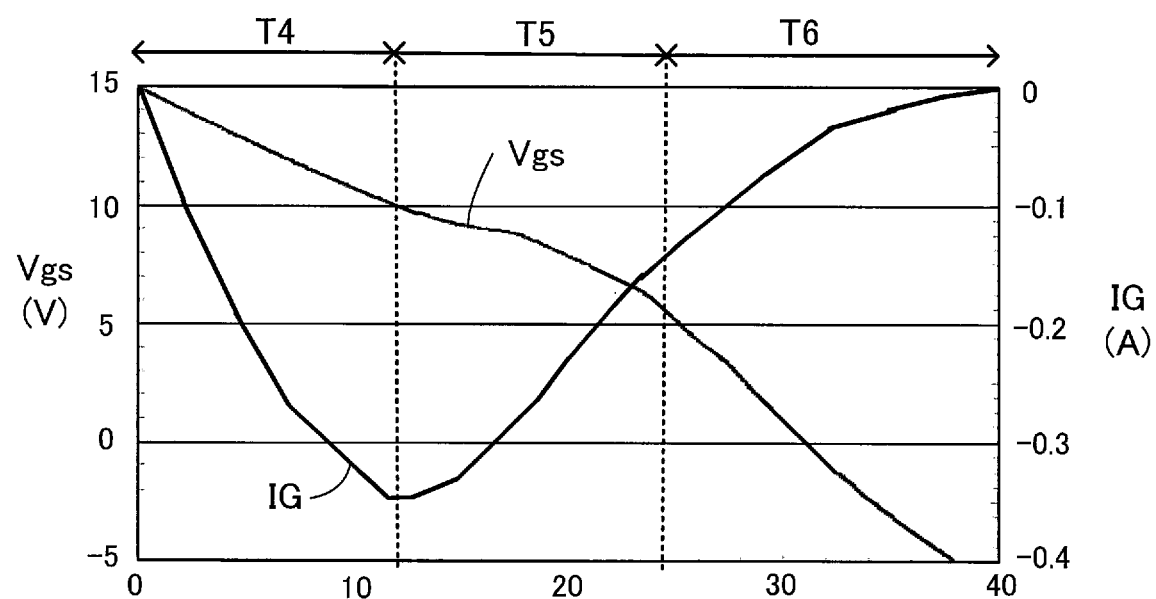
FIG. 21 illustrates simulated operation waveforms at the time of turning off of gate driving by a resistor of a conventional technology.
Figure 22:
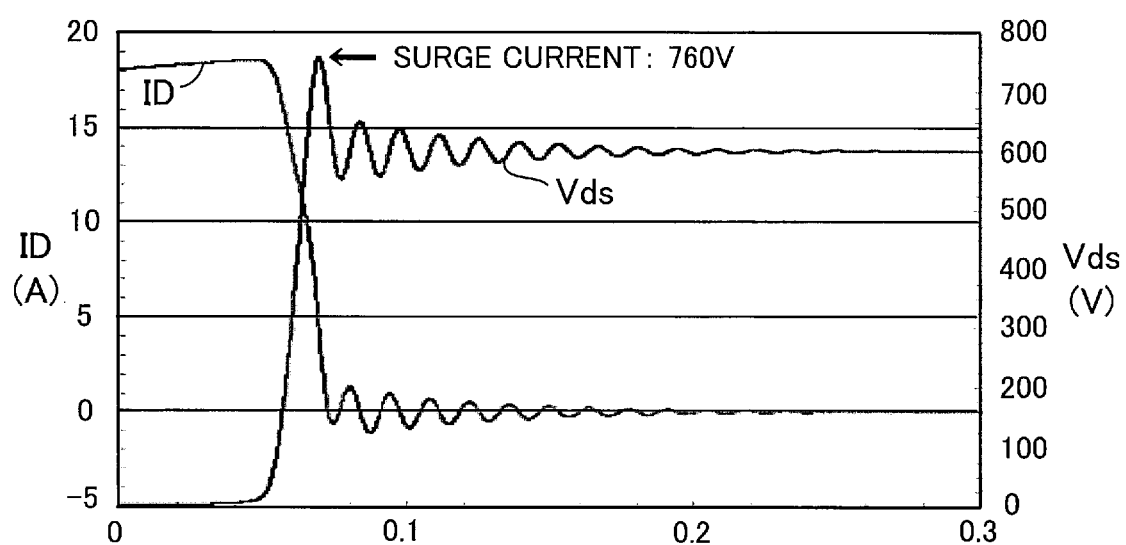
FIG. 22 illustrates simulated operation waveforms at the time of turning off of gate driving by a resistor of a conventional technology.

FIGS. 21 and 22 illustrate simulated operation waveforms of the conventional configuration at the time of turning off of gate driving by the resistor of the conventional technology. FIG. 21 illustrates waveforms of the gate voltage Vgs and the gate current IG at the time of turning off, with the horizontal axis representing time, the left vertical axis representing the gate voltage Vgs (V), and the right vertical axis representing the gate current IG (A).

A period T4 begins at the peak level of the gate voltage Vgs and ends at a Miller plateau during falling. A period T5 includes the Miller plateau during falling of the gate voltage Vgs. A period T6 begins at a time point at which the gate voltage Vgs goes out from the Miller plateau during falling and ends at a time point at which the gate voltage Vgs reaches the bottom level.

FIG. 22 illustrates waveforms of the drain voltage Vds and the drain current ID at the time of turning off, with the horizontal axis representing time, the left vertical axis representing the drain current ID (A), and the right vertical axis representing the drain voltage Vds (V). Surge voltage having a peak of 760 V is generated in the drain voltage Vds at the falling edge of the drain current ID.

Figure 23:
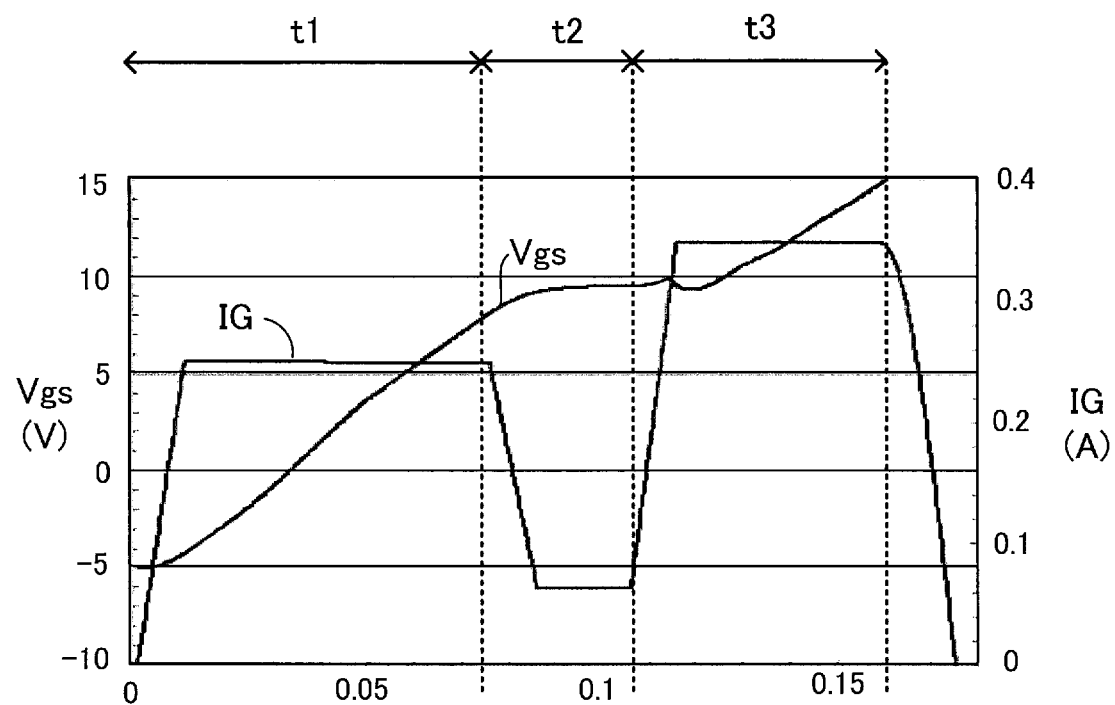
FIG. 23 illustrates simulated operation waveforms at the time of turning on in a pattern #1 of gate current switching.
Figure 24:
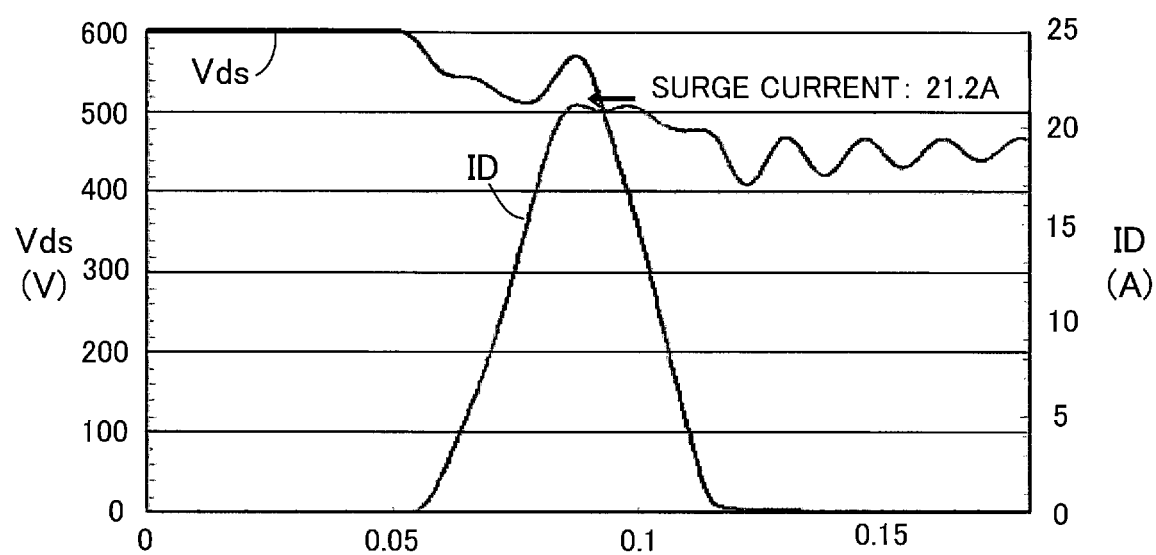
FIG. 24 illustrates simulated operation waveforms at the time of turning on in a pattern #1 of gate current switching.

FIGS. 23 and 24 illustrate simulated operation waveforms of the configuration of the electric power conversion circuit 1-1 of the present embodiment at the time of turning on in the pattern #1 of the gate current switching. FIG. 23 illustrates the waveforms of the gate voltage Vgs and the gate current IG at the time of turning on, with the horizontal axis representing time, the left vertical axis representing the gate voltage Vgs (V), and the right vertical axis representing the gate current IG (A).

A period t1 corresponds to the period T1 of FIG. 19, and the switch sw1 is turned on during the period t1 to flow the gate current Igon1. Also, a period t2 corresponds to the period T2 of FIG. 19, and the switch sw2 is turned on during the period t2 to flow the gate current Igon2. Further, a period t3 corresponds to the period T3 of FIG. 19, and the switch sw3 is turned on during the period t3 to flow the gate current Igon3.

FIG. 24 illustrates waveforms of the drain voltage Vds and the drain current ID at the time of turning on, with the horizontal axis representing time, the left vertical axis representing the drain voltage Vds (V), and the right vertical axis representing the drain current ID (A). Surge current having a peak of 21.2 A is generated in the drain current ID at the falling edge of the drain voltage Vds.

Figure 25:
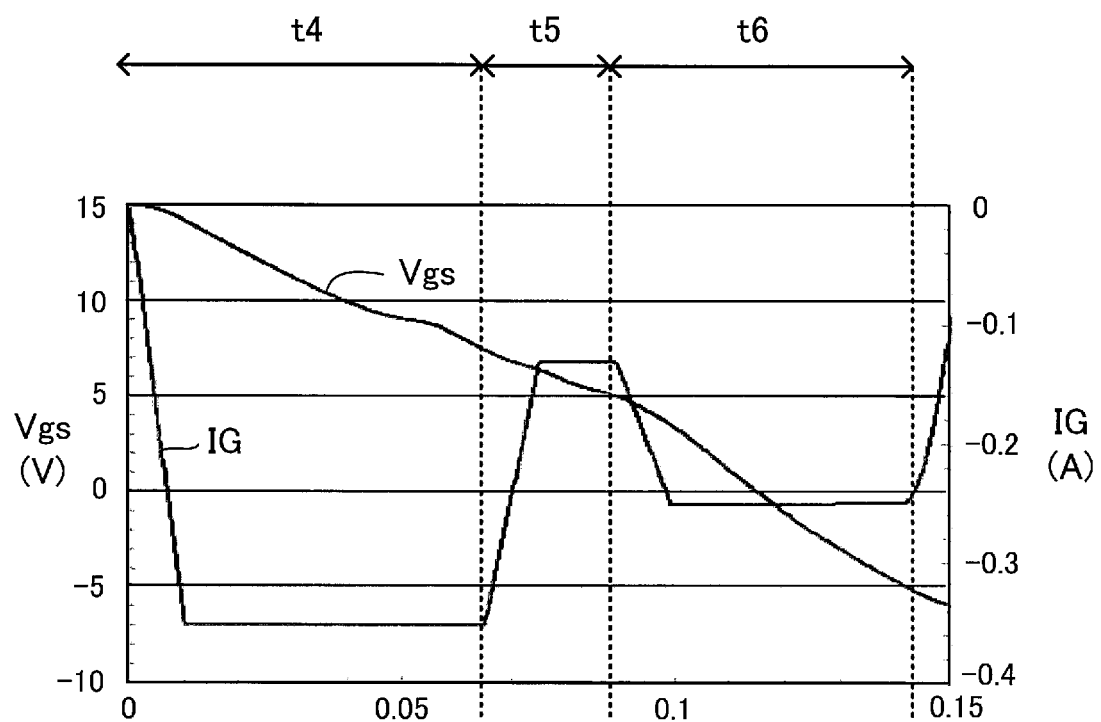
FIG. 25 illustrates simulated operation waveforms at the time of turning off in a pattern #1 of gate current switching.
Figure 26:
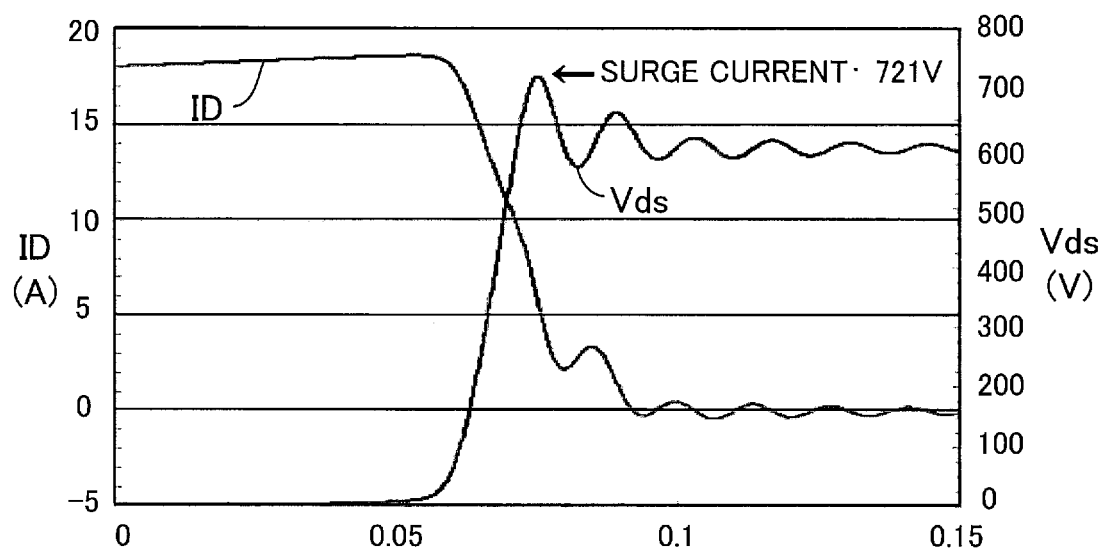
FIG. 26 illustrates simulated operation waveforms at the time of turning off in a pattern #1 of gate current switching.

FIGS. 25 and 26 illustrate simulated operation waveforms of the configuration of the electric power conversion circuit 1-1 of the present embodiment at the time of turning off in the pattern #1 of gate current switching. FIG. 25 illustrates the waveforms of the gate voltage Vgs and the gate current IG at the time of turning off, with the horizontal axis representing time, the left vertical axis representing the gate voltage Vgs (V), and the right vertical axis representing the gate current IG (A).

A period t4 corresponds to the period T4 of FIG. 21, and the switch sw4 is turned on during the period t4 to flow the gate current Igoff1. Also, a period t5 corresponds to the period T5 of FIG. 21, and the switch sw5 is turned on during the period t5 to flow the gate current Igoff2. Further, a period t6 corresponds to the period T6 of FIG. 21, and the switch sw6 is turned on during the period t6 to flow the gate current Igoff3.

FIG. 26 illustrates the waveforms of the drain voltage Vds and the drain current ID at the time of turning off, with the horizontal axis representing time, the left vertical axis representing the drain current ID (A), and the right vertical axis representing the drain voltage Vds (V). Surge voltage having a peak of 721 V is generated in the drain voltage Vds at the falling edge of the drain current ID.

Here, when FIG. 20 and FIG. 24 are compared, the surge current generated by gate driving by switching the electric current sources of the present embodiment is 1.9 A smaller than the surge current generated by conventional gate driving by the resistor, and the surge current is suppressed.

Also, when FIG. 22 and FIG. 26 are compared, the surge voltage generated by gate driving by switching the electric current sources of the present embodiment is 39 V smaller than the surge voltage generated by conventional gate driving by the resistor, and the surge voltage is suppressed.

Although the embodiments are illustrated in the above, the configuration of each unit illustrated in the embodiments may be replaced by another device having the same function. Also, optional components and processes may be added.

The quality of the power converter is improved by driving the gates in such a manner that the voltage gradients of the rising edge waveform and the falling edge waveform of the gate voltage of the switching element are switched between a plurality of levels.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A gate driver comprising:
  a plurality of turn-on current sources that switch a voltage gradient of a rising edge waveform of a gate voltage of a switching element between a plurality of levels, when the switching element is turned on;
  a plurality of turn-on switches that drive and control the turn-on current sources;
  a plurality of turn-off current sources that switch a voltage gradient of a falling edge waveform of the gate voltage between a plurality of levels, when the switching element is turned off; and
  a plurality of turn-off switches that drive and control the turn-off current sources, wherein
  in each of the rising edge waveform and the falling edge waveform of the gate voltage of the switching element, one of the plurality of levels of the voltage gradient corresponds substantially in time to a Miller plateau, the voltage gradient of said one level being smaller than that of each of the others of the plurality of levels.

2. The gate driver according to claim 1, wherein
  in order to divide the rising edge waveform of the gate voltage into n rising edge periods and to switch the voltage gradient of the rising edge waveform between n levels, n being equal to or greater than 3, the plurality of turn-on current sources corresponds to n turn-on current sources, and the plurality of turn-on switches corresponds to n turn-on switches, provided to cause different turn-on gate currents to flow through a gate of the switching element during the n rising edge periods, and in order to divide the falling edge waveform of the gate voltage into n falling edge periods and to switch the voltage gradient of the falling edge waveform between n levels, the plurality of turn-off current sources corresponds to n turn-off current sources and the plurality of turn-off switches corresponds to n turn-off switches, provided to sink different turn-off gate currents from the gate during the n falling edge periods.

3. A gate driver, comprising:

a plurality of turn-on current sources that switch a voltage gradient of a rising edge waveform of a gate voltage of a switching element between a plurality of levels, when the switching element is turned on;

a plurality of turn-on switches that drive and control the turn-on current sources;

a plurality of turn-off current sources that switch a voltage gradient of a falling edge waveform of the gate voltage between a plurality of levels, when the switching element is turned off; and a plurality of turn-off switches that drive and control the turn-off current sources, wherein in order to divide the rising edge waveform of the gate voltage into n rising edge periods and to switch the voltage gradient of the rising edge waveform between n levels, n being equal to or greater than 3, the plurality of turn-on current sources corresponds to n turn-on current sources, and the plurality of turn-on switches corresponds to n turn-on switches, provided to cause different turn-on gate currents to flow through a gate of the switching element during the n rising edge periods, in order to divide the falling edge waveform of the gate voltage into n falling edge periods and to switch the voltage gradient of the falling edge waveform between n levels, the plurality of turn-off current sources corresponds to n turn-off current sources and the plurality of turn-off switches corresponds to n turn-off switches, provided to sink different turn-off gate currents from the gate during the n falling edge periods, in order to switch the voltage gradient of the rising edge waveform between three rising levels, a first turn-on switch of the n turn-on switches is turned on during a first period between a bottom level of the gate voltage and a first Miller plateau in the rising edge waveform of the gate voltage, and a first turn-on current source of the n turn-on current sources supplies a first turn-on gate current of the different turn-on gate currents, the first turn-on gate current flowing through the gate during the first period, a second turn-on switch of the n turn-on switches is turned on during a second period corresponds to the first Miller plateau, and a second turn-on current source of the n turn-on current sources supplies a second turn-on gate current of the different turn-on gate currents, the second turn-on gate current flowing through the gate during the second period, and a third turn-on switch of the n turn-on switches is turned on during a third period between the first Miller plateau and a peak level of the gate voltage, and a third turn-on current source of the n turn-on current sources supplies a third turn-on gate current of the different turn-on gate currents, the third turn-on gate current flowing through the gate during the third period, and in order to switch the voltage gradient of the falling edge waveform between three falling levels, a first turn-off switch of the n turn-off switches is turned on during a fourth period between the peak level and a second Miller plateau in the falling edge waveform, and a first turn-off current source of the n turn-off current sources sinks a first turn-off gate current of the different turn-off gate currents from the gate during the fourth period, a second turn-off switch of the n turn-off switches is turned on during a fifth period that corresponds to the second Miller plateau, and a second turn-off current source of the n turn-off current sources sinks a second turn-off gate current of the different turn-off gate currents from the gate during the fifth period, and a third turn-off switch of the n turn-off switches is turned on during a sixth period between the second Miller plateau and the bottom level, and a third turn-off current source of the n turn-off current sources sinks a third turn-off gate current of the different turn-off gate currents from the gate during the sixth period.

4. The gate driver according to claim 3, wherein when the switching element is on, the first turn-on gate current is larger than the second turn-on gate current, and the third turn-on gate current is larger than the first turn-on gate current, and when the switching element is off, the third turn-off gate current is larger than the second turn-off gate current, and the first turn-off gate current is larger than the third turn-off gate current.

5. The gate driver according to claim 3, wherein when the switching element is on, the third turn-on gate current is larger than the second turn-on gate current, and the first turn-on gate current is larger than the third turn-on gate current, and when the switching element is off, the first turn-off gate current is larger than the second turn-off gate current, and the third turn-off gate current is larger than the first turn-off gate current.

6. The gate driver according to claim 3, wherein when the switching element is on, the second turn-on gate current is larger than the third turn-on gate current, and the first turn-on gate current is larger than the second turn-on gate current, and when the switching element is off, the second turn-off gate current is larger than the third turn-off gate current, and the first turn-off gate current is larger than the second turn-off gate current.

7. A gate driver, comprising:

a plurality of turn-on current sources that switch a voltage gradient of a rising edge waveform of a gate voltage of a switching element between a plurality of levels, when the switching element is turned on;

a plurality of turn-on switches that drive and control the turn-on current sources;

a plurality of turn-off current sources that switch a voltage gradient of a falling edge waveform of the gate voltage between a plurality of levels, when the switching element is turned off;

a plurality of turn-off switches that drive and control the turn-off current sources; and a monitor circuit that monitors a drain voltage of the switching element, wherein in order to divide the rising edge waveform of the gate voltage into n rising edge periods and to switch the voltage gradient of the rising edge waveform between n levels, n being equal to or greater than 3, the plurality of turn-on current sources corresponds to n turn-on current sources, and the plurality of turn-on switches corresponds to n turn-on switches, provided to cause different turn-on gate currents to flow through a gate of the switching element during the n rising edge periods, in order to divide the falling edge waveform of the gate voltage into n falling edge periods and to switch the voltage gradient of the falling edge waveform between n levels, the plurality of turn-off current sources corresponds to n turn-off current sources and the plurality of turn-off switches corresponds to n turn-off switches, provided to sink different turn-off gate currents from the gate during the n falling edge periods, the monitor circuit detects an overvoltage generated in the drain voltage when the switching element is off, and when the overvoltage is detected, at least one of the n turn-on switches is turned on to cause a corresponding turn-on gate current to flow through the gate from at least one of the n turn-on current sources.

* * * * *